US010453798B2

(12) United States Patent
Tsutsumi et al.

(10) Patent No.: US 10,453,798 B2
(45) Date of Patent: Oct. 22, 2019

(54) THREE-DIMENSIONAL MEMORY DEVICE WITH GATED CONTACT VIA STRUCTURES AND METHOD OF MAKING THEREOF

(71) Applicant: SANDISK TECHNOLOGIES LLC, Plano, TX (US)

(72) Inventors: Masanori Tsutsumi, Yokkaichi (JP); Naohiro Hosoda, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 44 days.

(21) Appl. No.: 15/717,102

(22) Filed: Sep. 27, 2017

(65) Prior Publication Data
US 2019/0096808 A1    Mar. 28, 2019

(51) Int. Cl.
| H01L 23/535 | (2006.01) |
| H01L 21/768 | (2006.01) |
| H01L 27/11582 | (2017.01) |
| H01L 27/11556 | (2017.01) |
| H01L 27/11565 | (2017.01) |
| H01L 27/1157 | (2017.01) |
| H01L 27/11575 | (2017.01) |

(52) U.S. Cl.
CPC ...... *H01L 23/535* (2013.01); *H01L 21/76895* (2013.01); *H01L 27/1157* (2013.01); *H01L 27/11556* (2013.01); *H01L 27/11565* (2013.01); *H01L 27/11575* (2013.01); *H01L 27/11582* (2013.01)

(58) Field of Classification Search
CPC ............. H01L 23/535; H01L 27/11556; H01L 27/11565
See application file for complete search history.

(56) References Cited

U.S. PATENT DOCUMENTS

| 5,915,167 A | 6/1999 | Leedy |
| 6,881,994 B2 | 4/2005 | Lee et al. |
| 7,005,350 B2 | 2/2006 | Walker et al. |

(Continued)

FOREIGN PATENT DOCUMENTS

WO   WO2002/015277 A2   2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Marc Anthony Armand
(74) *Attorney, Agent, or Firm* — The Marbury Law Group PLLC

(57) ABSTRACT

A three-dimensional memory device includes laterally spaced apart vertically alternating stacks of insulating strips and word line electrically conductive strips located over a substrate, memory stack structures extending through the multiple vertically alternating stacks, word line contact via structures contacting a top surface of the respective word line electrically conductive strips, field effect transistors overlying the word line contact via structures, and connector line structures which are electrically connected to respective subsets of the word line electrically conductive strips in different vertically alternating stacks through the field effect transistors.

13 Claims, 41 Drawing Sheets

(56) References Cited

U.S. PATENT DOCUMENTS

| | | | |
|---|---|---|---|
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,696,559 B2 | 4/2010 | Arai et al. | |
| 7,745,265 B2 | 6/2010 | Mokhlesi et al. | |
| 7,746,680 B2 | 6/2010 | Scheuerlein et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,107,270 B2 | 1/2012 | Scheuerlein et al. | |
| 8,187,936 B2 | 5/2012 | Alsmeier et al. | |
| 8,349,681 B2 | 1/2013 | Alsmeier et al. | |
| 8,394,716 B2 | 3/2013 | Hwang et al. | |
| 8,461,000 B2 | 6/2013 | Alsmeier et al. | |
| 8,580,639 B2 | 11/2013 | Alsmeier et al. | |
| 8,603,906 B2 | 12/2013 | Shim et al. | |
| 8,643,142 B2 | 2/2014 | Higashitani et al. | |
| 8,765,543 B2 | 7/2014 | Alsmeier et al. | |
| 8,901,745 B2 | 12/2014 | Hwang et al. | |
| 9,023,719 B2 | 5/2015 | Pachamuthu et al. | |
| 9,224,747 B2 | 12/2015 | Mizutani et al. | |
| 9,230,905 B2 | 1/2016 | Takaki et al. | |
| 9,236,392 B1 | 1/2016 | Izumi et al. | |
| 9,305,934 B1 | 4/2016 | Ding et al. | |
| 9,449,987 B1 | 9/2016 | Miyata et al. | |
| 9,543,318 B1 | 1/2017 | Lu et al. | |
| 9,589,981 B2 | 3/2017 | Nishikawa et al. | |
| 9,620,512 B1 | 4/2017 | Nishikawa et al. | |
| 9,627,403 B2 | 4/2017 | Liu et al. | |
| 9,646,981 B2 | 5/2017 | Nishikawa et al. | |
| RE46,435 E | 6/2017 | Scheuerlein et al. | |
| 9,673,213 B1 | 6/2017 | Yu et al. | |
| 2007/0210338 A1 | 9/2007 | Orlowski | |
| 2007/0252201 A1 | 11/2007 | Kito et al. | |
| 2009/0230449 A1 | 9/2009 | Sakaguchi et al. | |
| 2009/0242967 A1 | 10/2009 | Katsumata et al. | |
| 2009/0268523 A1 | 10/2009 | Maejima | |
| 2010/0013049 A1 | 1/2010 | Tanaka et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0031546 A1 | 2/2011 | Uenaka et al. | |
| 2011/0076819 A1 | 3/2011 | Kim et al. | |
| 2011/0133606 A1 | 6/2011 | Yoshida et al. | |
| 2011/0147824 A1 | 6/2011 | Son et al. | |
| 2011/0169071 A1 | 7/2011 | Uenaka et al. | |
| 2011/0169072 A1 | 7/2011 | Lim et al. | |
| 2011/0266606 A1 | 11/2011 | Park et al. | |
| 2011/0284943 A1 | 11/2011 | Hwang et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2012/0119287 A1 | 5/2012 | Park et al. | |
| 2013/0113033 A1 | 5/2013 | Choi et al. | |
| 2013/0130468 A1 | 5/2013 | Higashitani et al. | |
| 2013/0161821 A1 | 6/2013 | Hwang et al. | |
| 2013/0264631 A1 | 10/2013 | Alsmeier et al. | |
| 2013/0313627 A1 | 11/2013 | Lee et al. | |
| 2014/0061750 A1* | 3/2014 | Kwon | H01L 27/1052 257/314 |
| 2014/0061766 A1 | 3/2014 | Kito et al. | |
| 2014/0131787 A1 | 5/2014 | Alsmeier | |
| 2014/0175530 A1 | 6/2014 | Chien et al. | |
| 2014/0264934 A1 | 9/2014 | Chen et al. | |
| 2015/0076584 A1 | 3/2015 | Pachamuthu et al. | |
| 2015/0079741 A1* | 3/2015 | Choi | H01L 29/66833 438/257 |
| 2015/0179659 A1 | 6/2015 | Takaki | |
| 2015/0179660 A1* | 6/2015 | Yada | H01L 21/02164 257/321 |
| 2016/0064281 A1 | 3/2016 | Izumi et al. | |
| 2016/0351709 A1 | 12/2016 | Nishikawa et al. | |
| 2017/0179026 A1 | 6/2017 | Toyama et al. | |
| 2017/0179151 A1 | 6/2017 | Kai et al. | |
| 2017/0179152 A1 | 6/2017 | Toyama et al. | |
| 2017/0179153 A1 | 6/2017 | Ogawa et al. | |
| 2017/0179154 A1 | 6/2017 | Furihata et al. | |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report and Written Opinion of the International Searching Authority for International Patent Application No. PCT/US2011/042566, dated Jan. 17, 2012.

Invitation to Pay Additional Fees & Partial International Search Report, PCT/US2011/042566, dated Sep. 28, 2011.

International Search Report and Written Opinion of the International Searching Authority for International Patent Application No. PCT/US2013/035567, dated Sep. 30, 2013, 6pgs.

International Search Report and Written Opinion of the International Searching Authority for International Application No. PCT/US2015/021767; dated Jun. 24, 2015.

International Search Report and Written Opinion of the International Searching Authority for International Patent Application No. PCT/US2016/067872, dated Mar. 17, 2017, 12 pages.

* cited by examiner

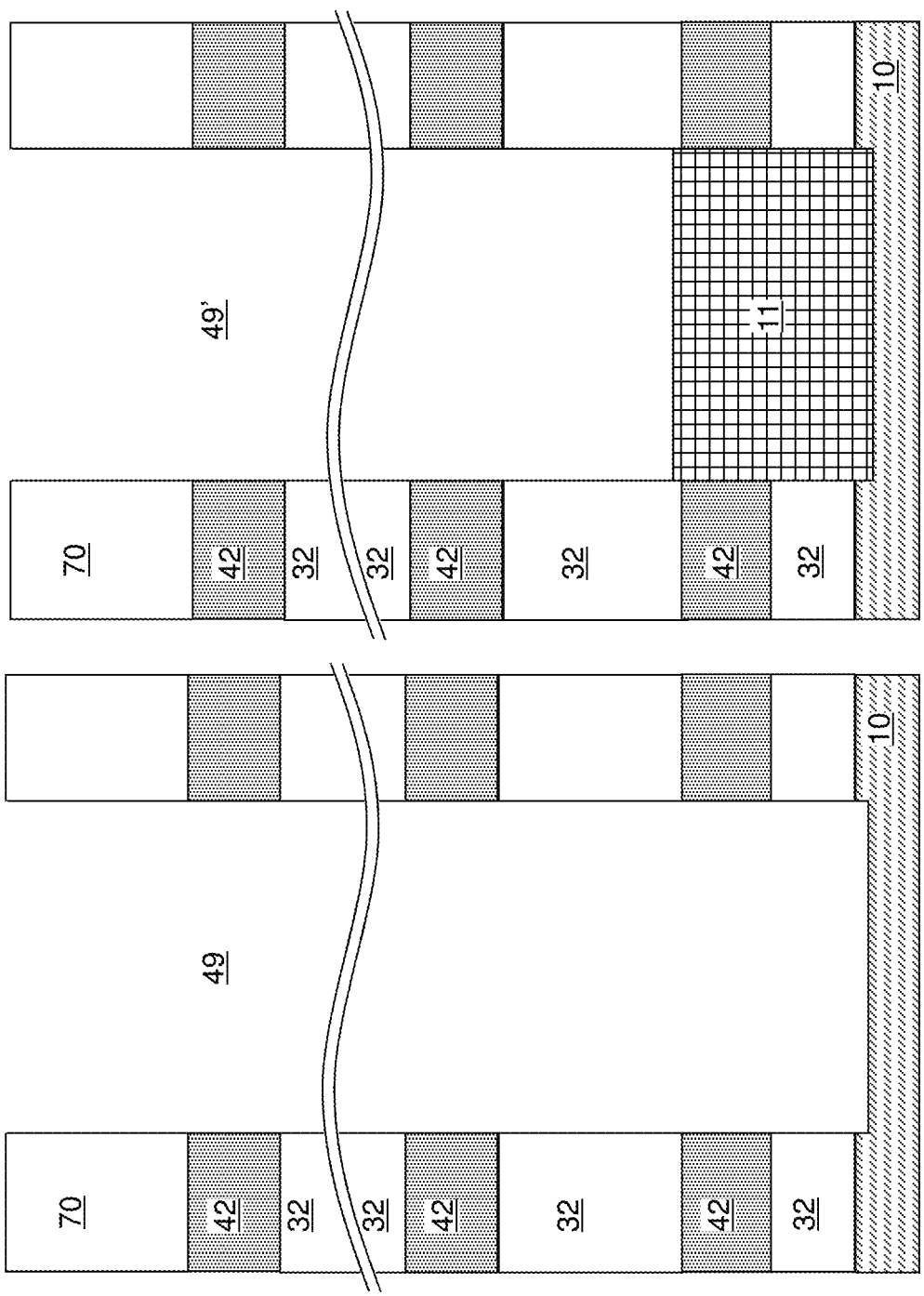

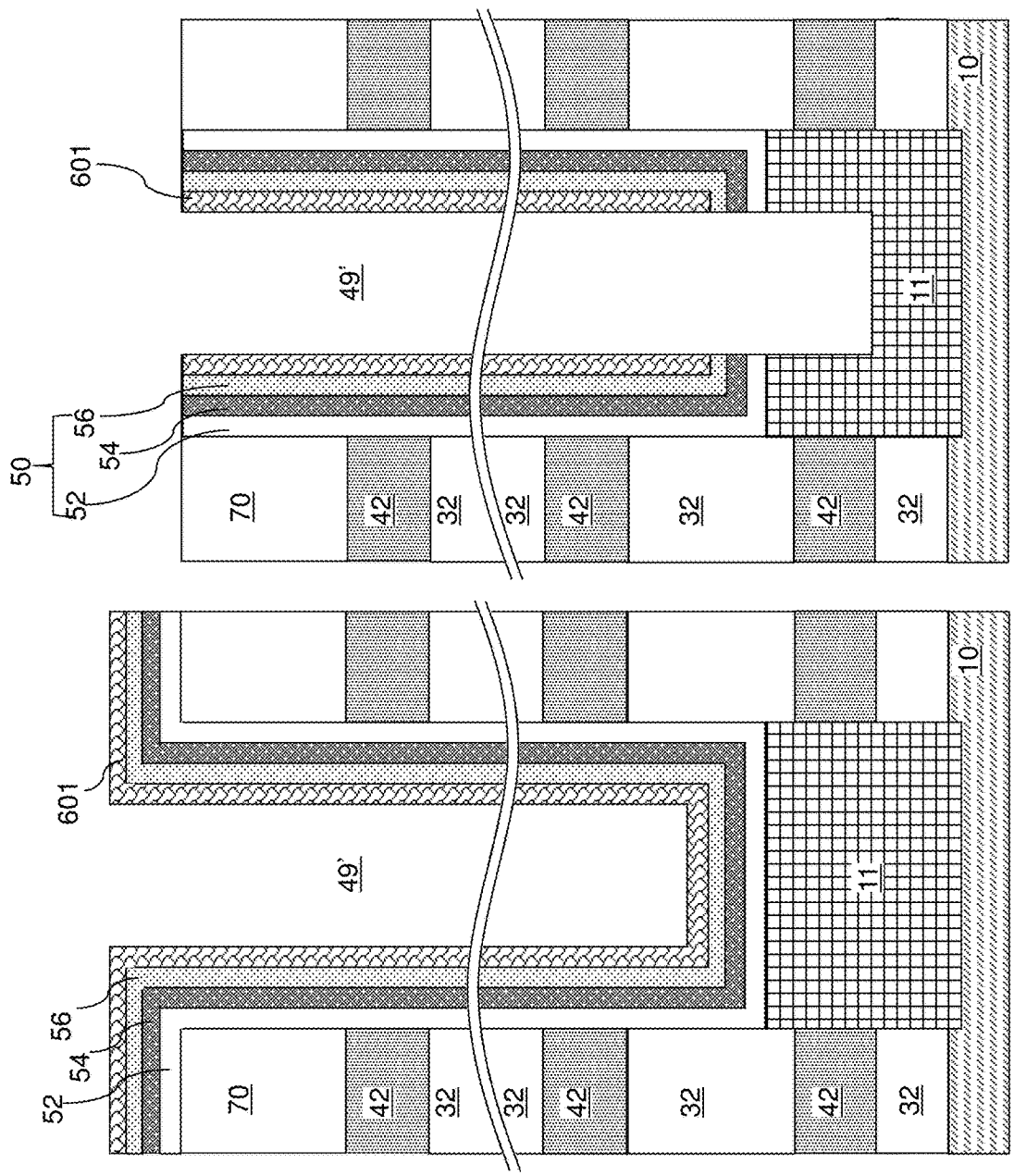

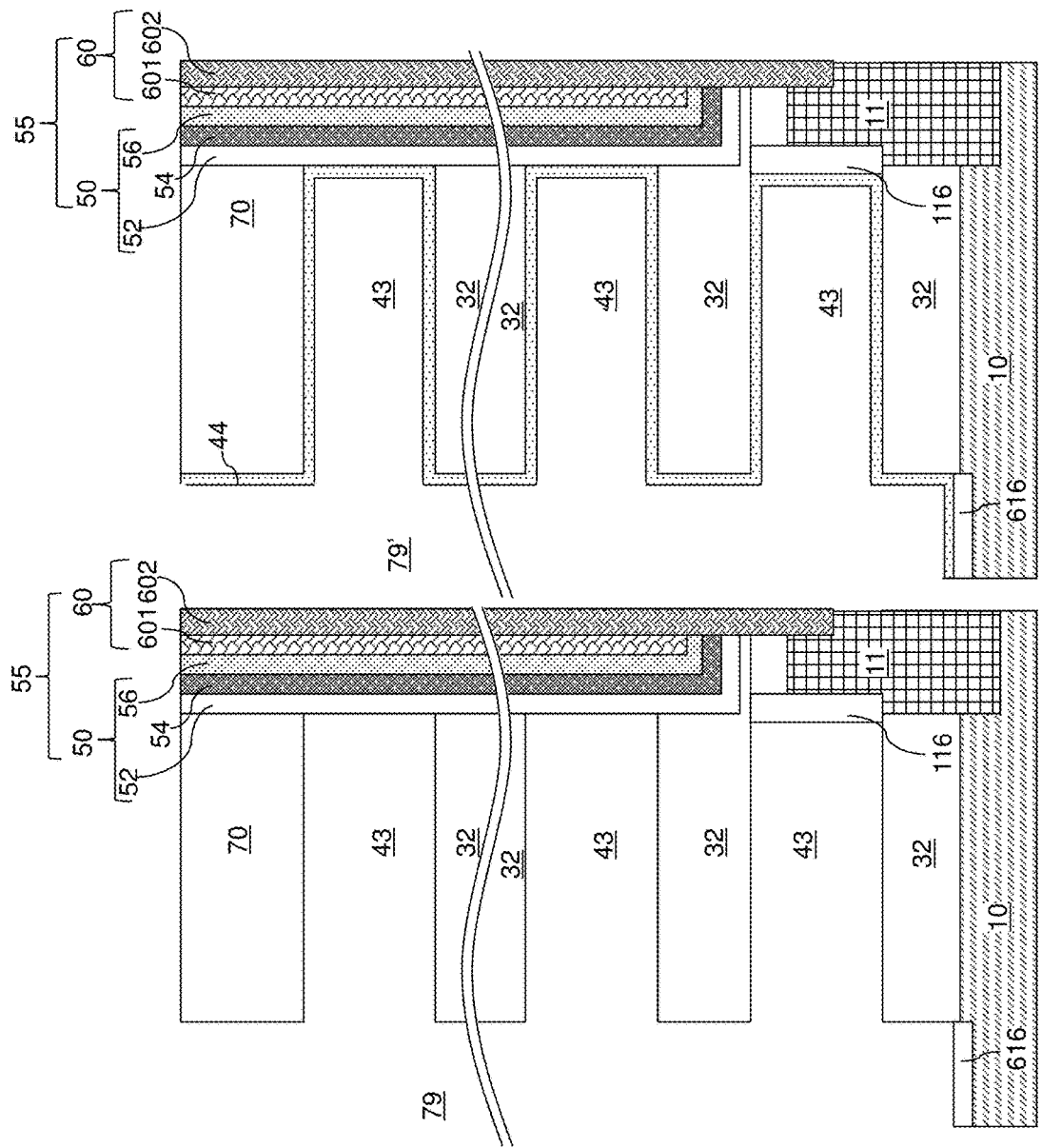

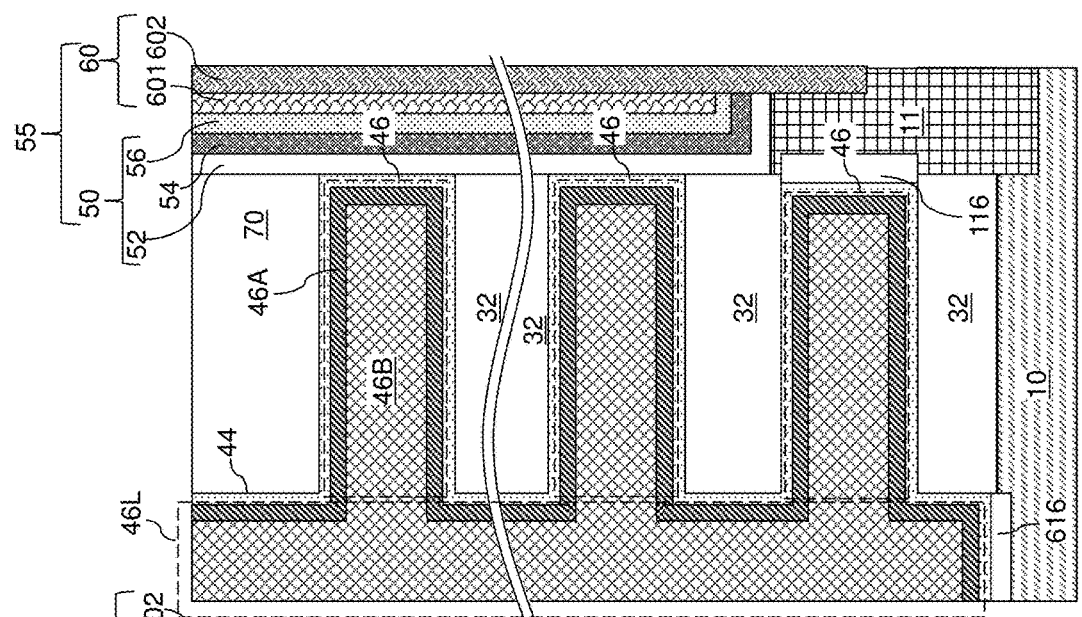
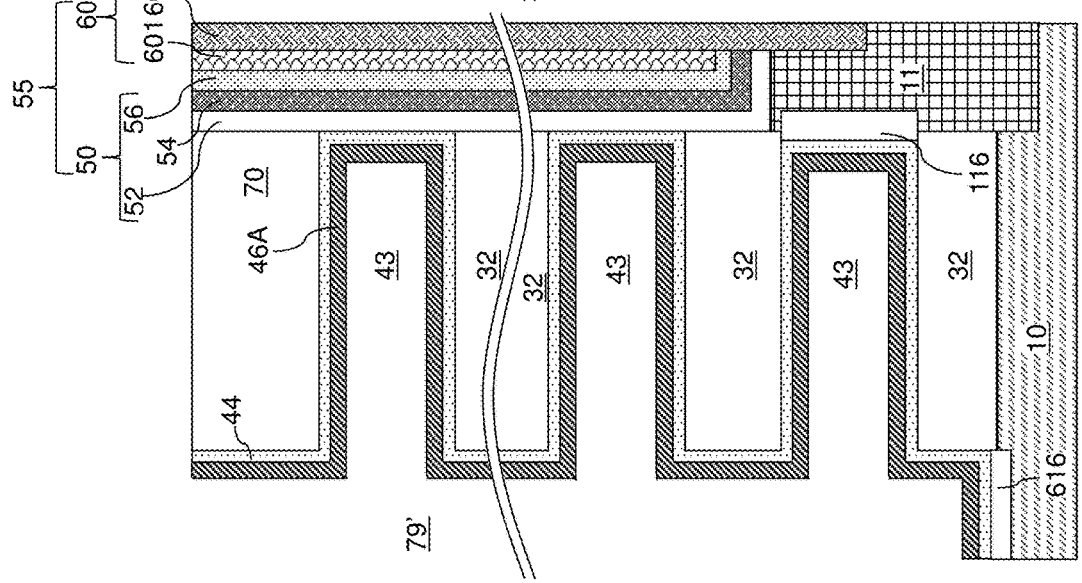

THREE-DIMENSIONAL MEMORY DEVICE WITH GATED CONTACT VIA STRUCTURES AND METHOD OF MAKING THEREOF

FIELD

The present disclosure relates generally to the field of semiconductor devices, and particular to a three-dimensional memory device containing gated contact via structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises multiple vertically alternating stacks of insulating strips and word line electrically conductive strips located over a substrate, wherein the multiple vertically alternating stacks are laterally spaced from each other, memory stack structures extending through the multiple vertically alternating stacks, wherein each of the memory stack structures extends through a respective one of the multiple vertically alternating stacks and each of the memory stack structures comprises a memory film and a vertical semiconductor channel contacting an inner sidewall of the memory film, word line contact via structures contacting a top surface of the respective word line electrically conductive strips, field effect transistors overlying the word line contact via structures, each field effect transistor comprising a semiconductor channel, a gate dielectric and a gate electrode, and connector line structures which are electrically connected to respective subsets of the word line electrically conductive strips in different vertically alternating stacks through a subset of the semiconductor channels.

According to another aspect of the present disclosure, a method of forming a three-dimensional memory device comprises forming a continuous alternating stack of continuous insulating layers and continuous sacrificial material layers, forming memory openings through the continuous alternating stack, forming memory stack structures comprising a memory film and a vertical semiconductor channels in the memory openings, forming backside trenches laterally extending along a first horizontal direction through the continuous alternating stack, wherein the continuous alternating stack is divided into multiple in-process vertically alternating stacks, replacing remaining portions of the continuous sacrificial material layers with word line conductive material strips through the backside trenches to form multiple alternating stacks, forming word line contact via structures on top surfaces of the respective word line electrically conductive strips, forming field effect transistors over and electrically connected to the word line contact via structures, and forming connector line structures which are electrically connected to respective subsets of the word line electrically conductive strips in different alternating stacks through a subset of the semiconductor channels.

BRIEF DESCRIPTION OF THE DRAWINGS

FIGS. 5A-5H are sequential schematic vertical cross-sectional views of a memory opening within the exemplary structure up to the processing step of deposition of a second semiconductor channel layer according to an embodiment of the present disclosure.

FIGS. 9A-9D are sequential vertical cross-sectional views of a region of the exemplary structure during formation of electrically conductive strips according to an embodiment of the present disclosure.

DETAILED DESCRIPTION

Figure 1:
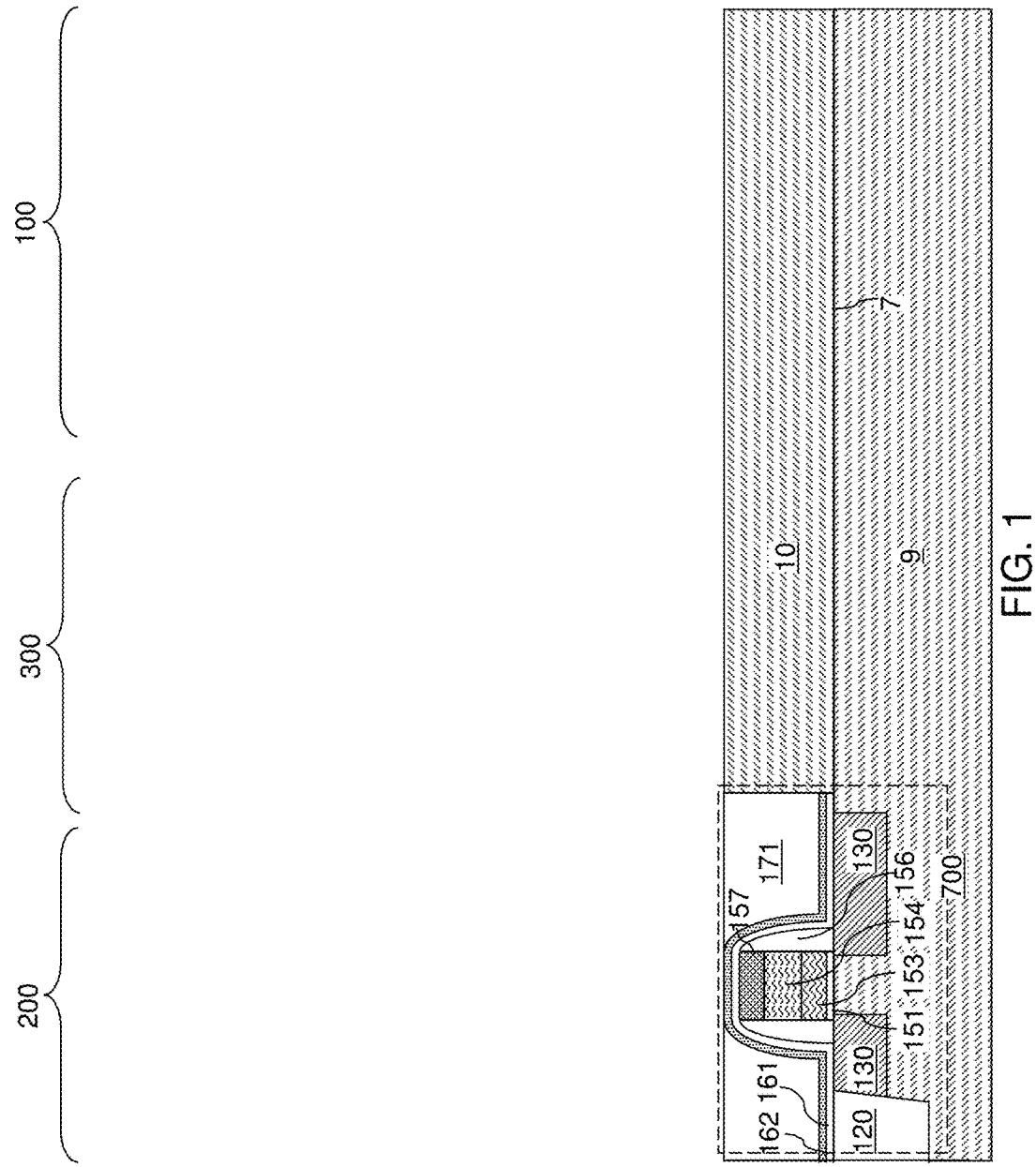
FIG. 1 is a schematic vertical cross-sectional view of an exemplary structure after formation of at least one peripheral device and a semiconductor material layer according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Wherever physical contact between two elements is illustrated in the drawings, direct physical contact between the two elements is provided. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include be a single memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks (i.e., memory blocks), which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (151, 153, 154, 157), each of which can include a gate dielectric 151, a gate electrode (153, 154), and a gate cap dielectric 157. The gate electrode (153, 154) may include a stack of a first gate electrode portion 153 and a second gate electrode portion 154. At least one gate spacer 156 can be formed around the at least one gate structure (151, 153, 154, 157) by depositing and anisotropically etching a dielectric liner. Active regions 130 can be formed in upper portions of the substrate semiconductor layer 9, for example, by introducing electrical dopants employing the at least one gate structure (151, 153, 154, 157) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 171. In one embodiment the planarized top surface of the planarization dielectric layer 171 can be coplanar with a top surface of the dielectric liners (161, 162). Subsequently, the planarization dielectric layer 171 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 171 can be removed, for example, by chemical mechanical planarization (CMP). In this case, the semiconductor material layer 10 can have a top surface that is coplanar with the top surface of the planarization dielectric layer 171.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
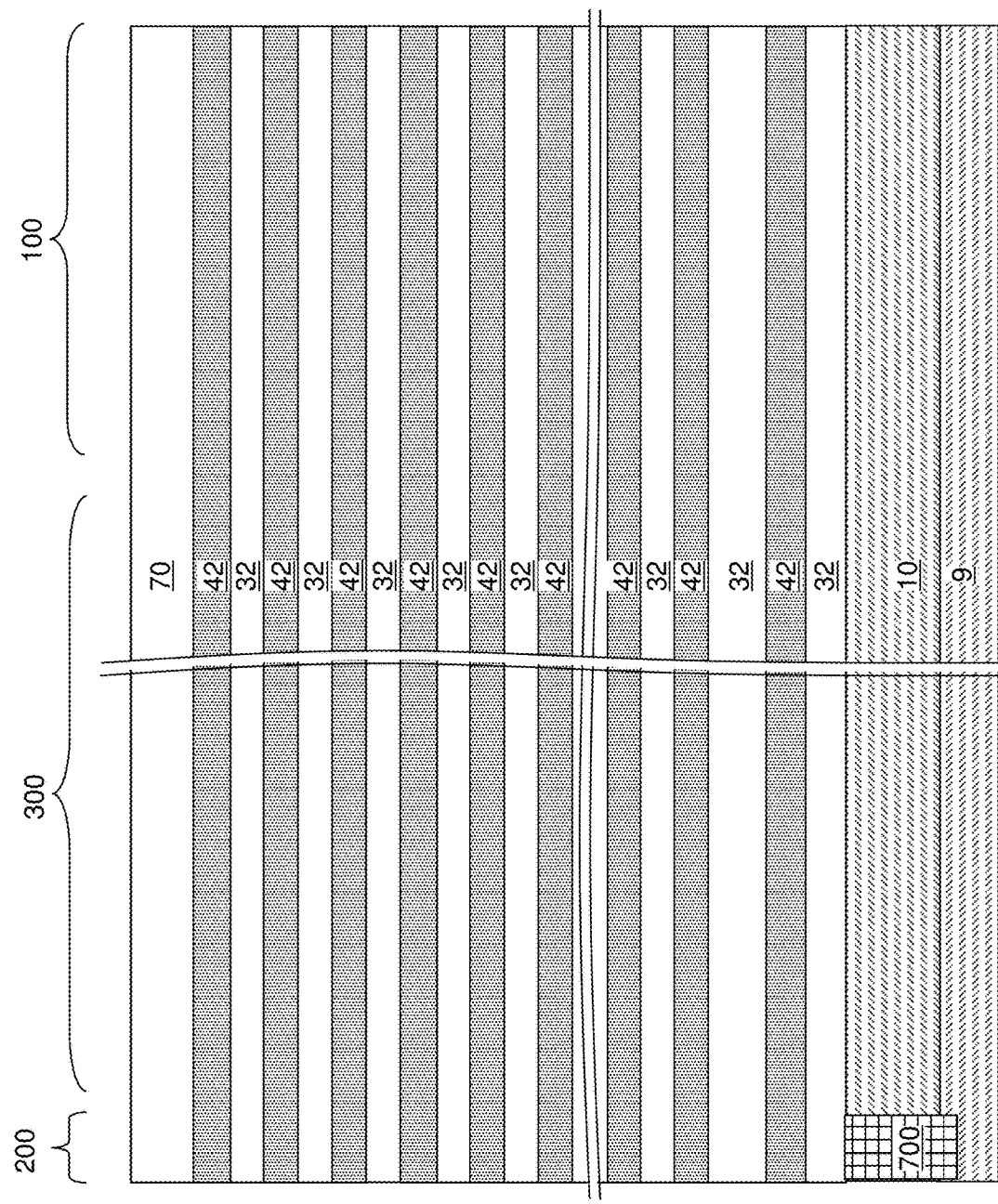
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The alternating plurality of the first material layers and the second material layers can be formed as a continuous alternating stack of continuous insulating layers and continuous sacrificial material layers that cover the entire top surface of the substrate (9, 10). For example, each of the insulating layers 32 can be formed as a continuous insulating layer laterally extending over the entire area of the substrate (9, 10), and each of the sacrificial material layers 42 can be formed as a continuous sacrificial material layer laterally extending over the entire area of the substrate (9, 10).

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
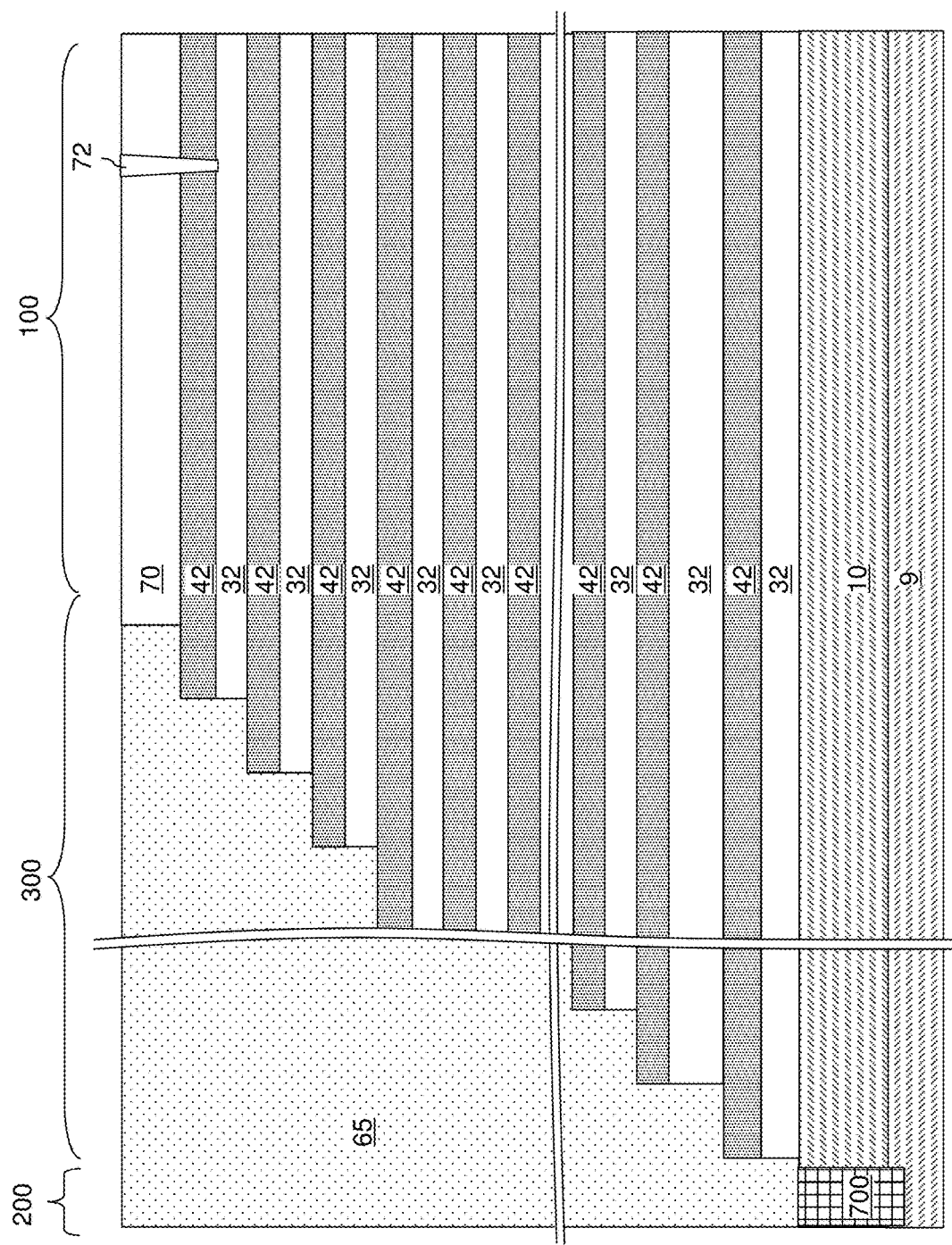
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70. Each drain select level isolation structure 72 can laterally divide an area of a block (i.e., memory block) B into sub-blocks S (e.g., memory strings). As used herein, a block is a smallest unit of memory elements that can be erased in a single erase operation. Each block B can share a word line in each vertical device level. A sub-block is a subset of the block that is less than the block. Each sub-block can share a drain select gate in each vertical device level.

Figure 4A:
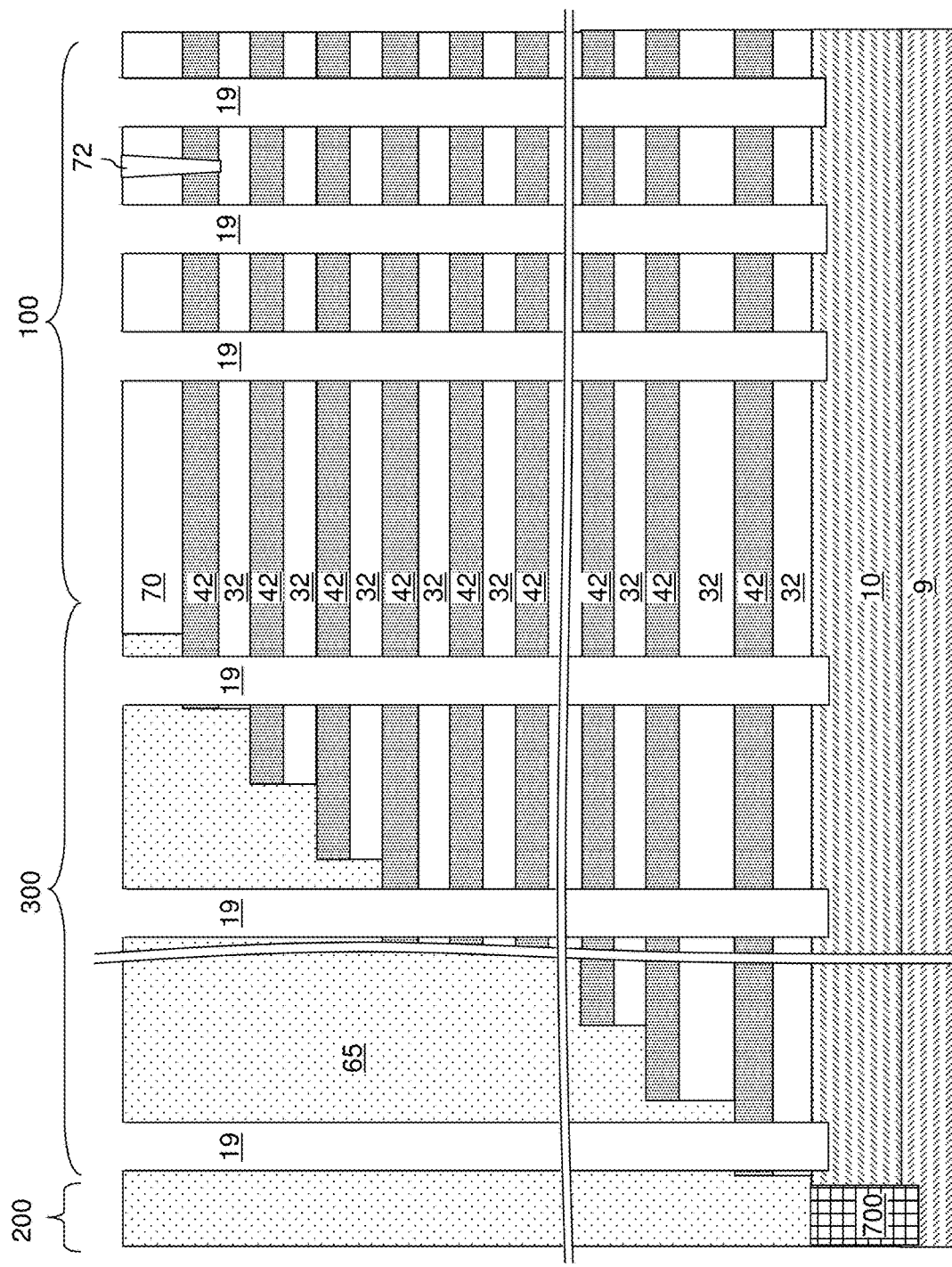
FIG. 4A is a schematic vertical cross-sectional view of the exemplary structure after formation of memory openings and support openings according to an embodiment of the present disclosure.
Figure 4B:
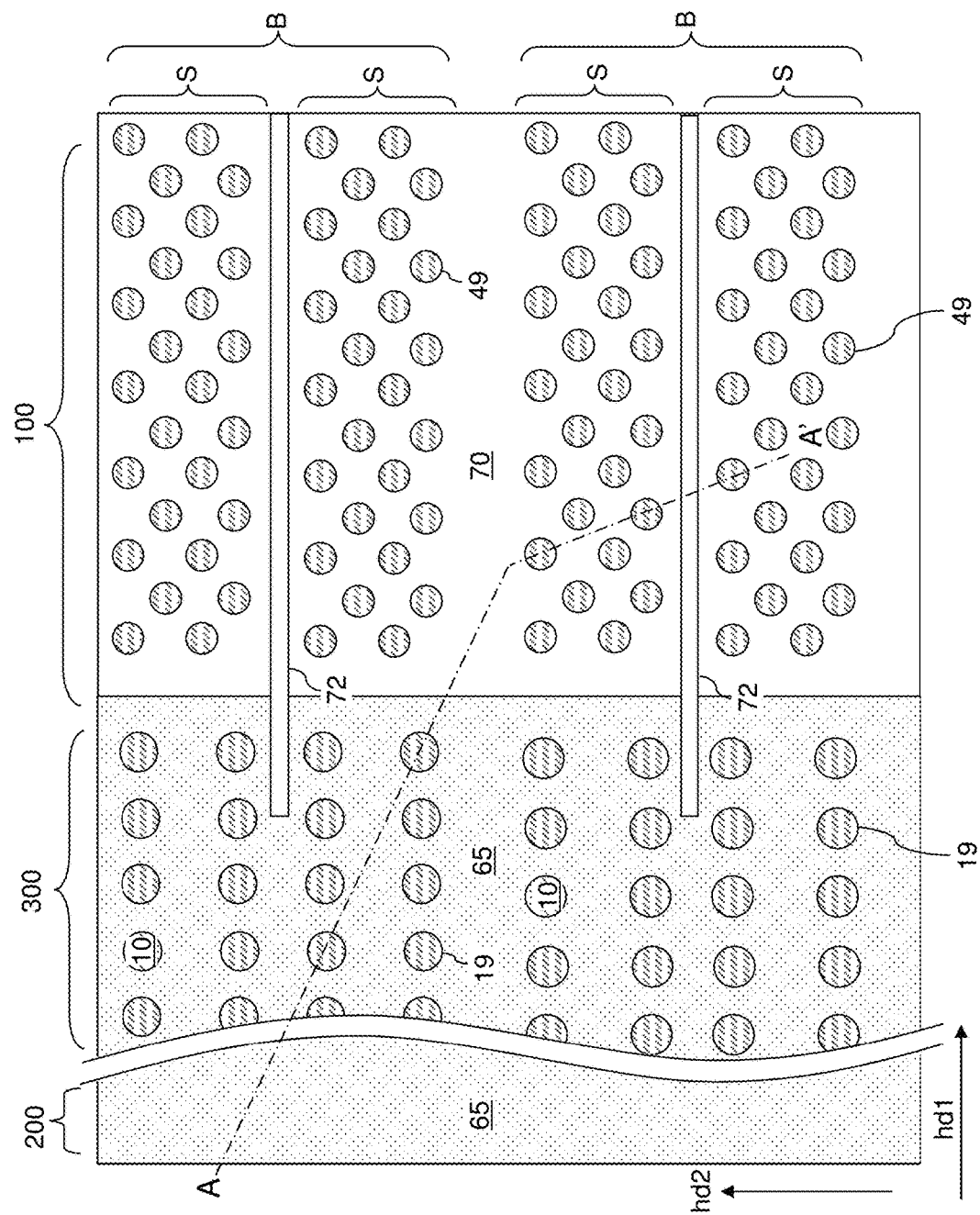
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (which comprises the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5E:
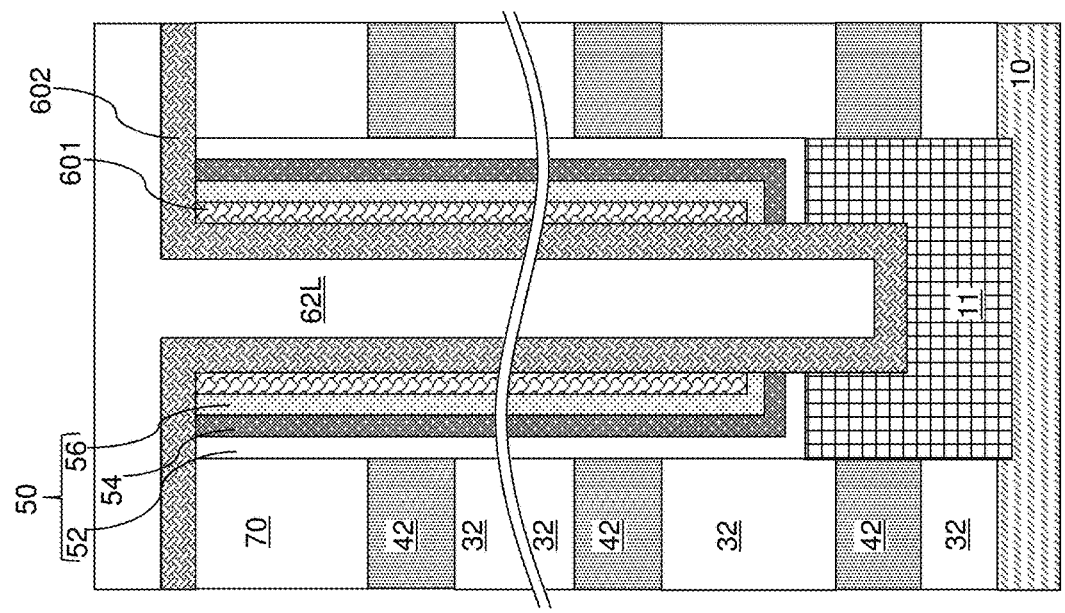

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5F:
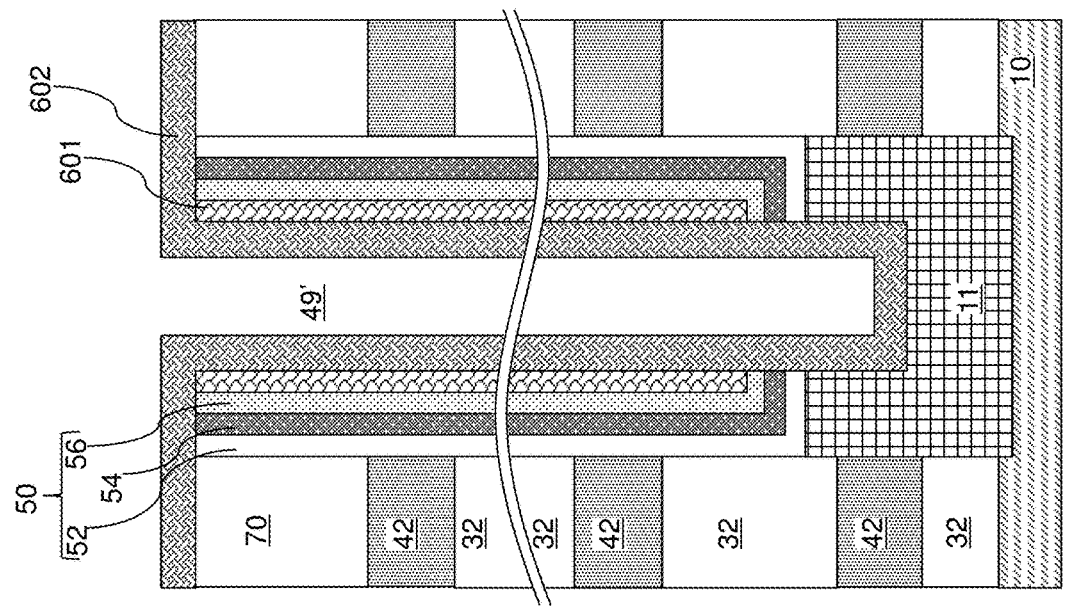

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5G:
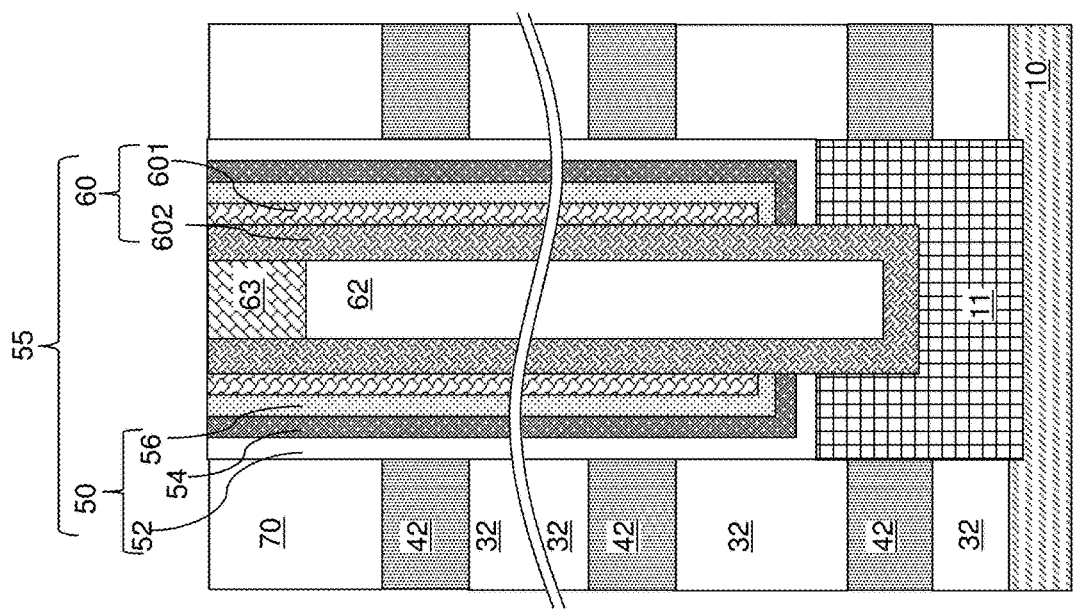

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5H:
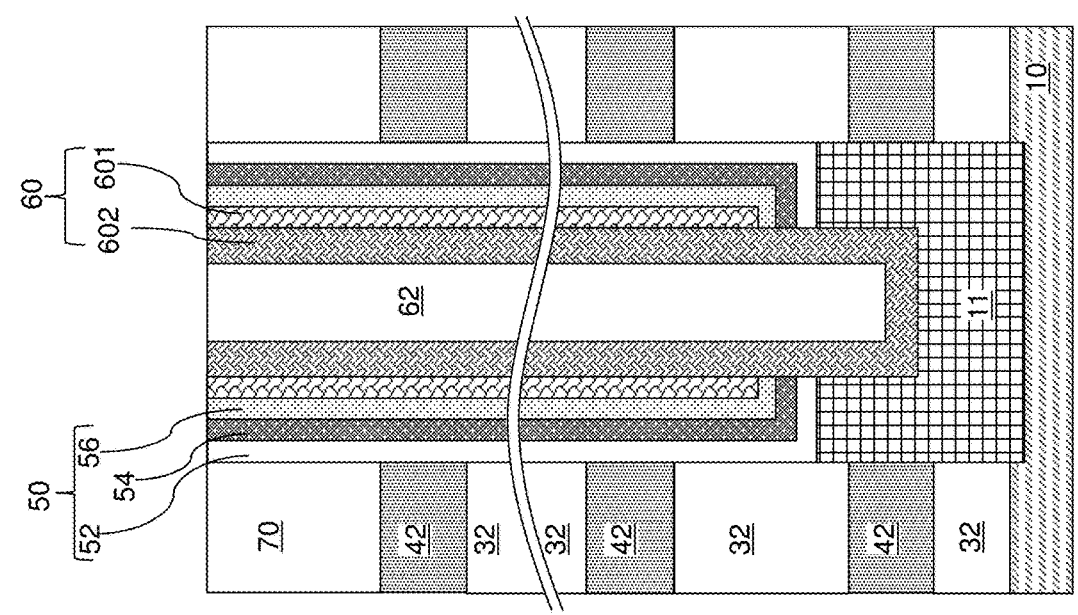

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20. See FIG. 6.

Figure 6:
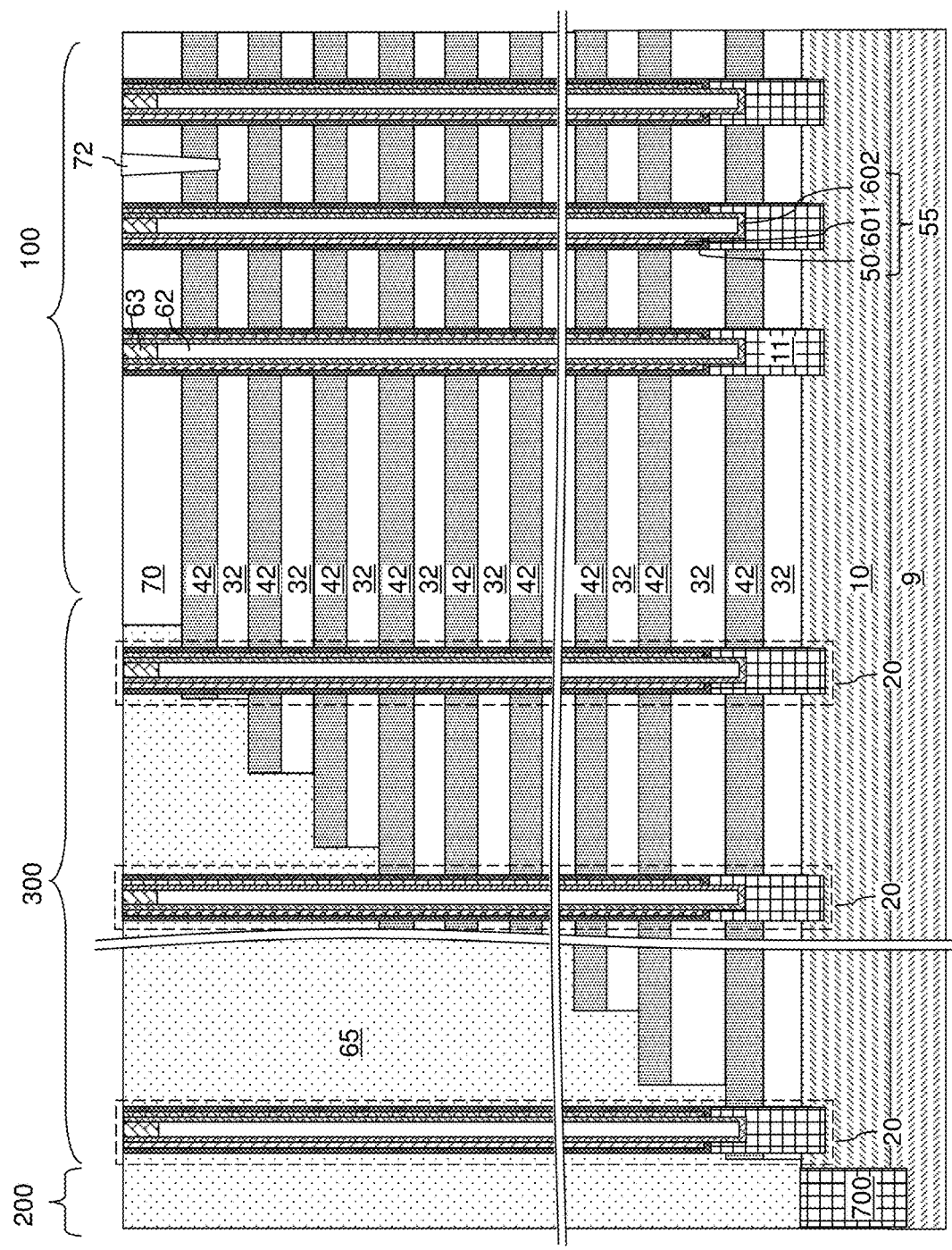
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
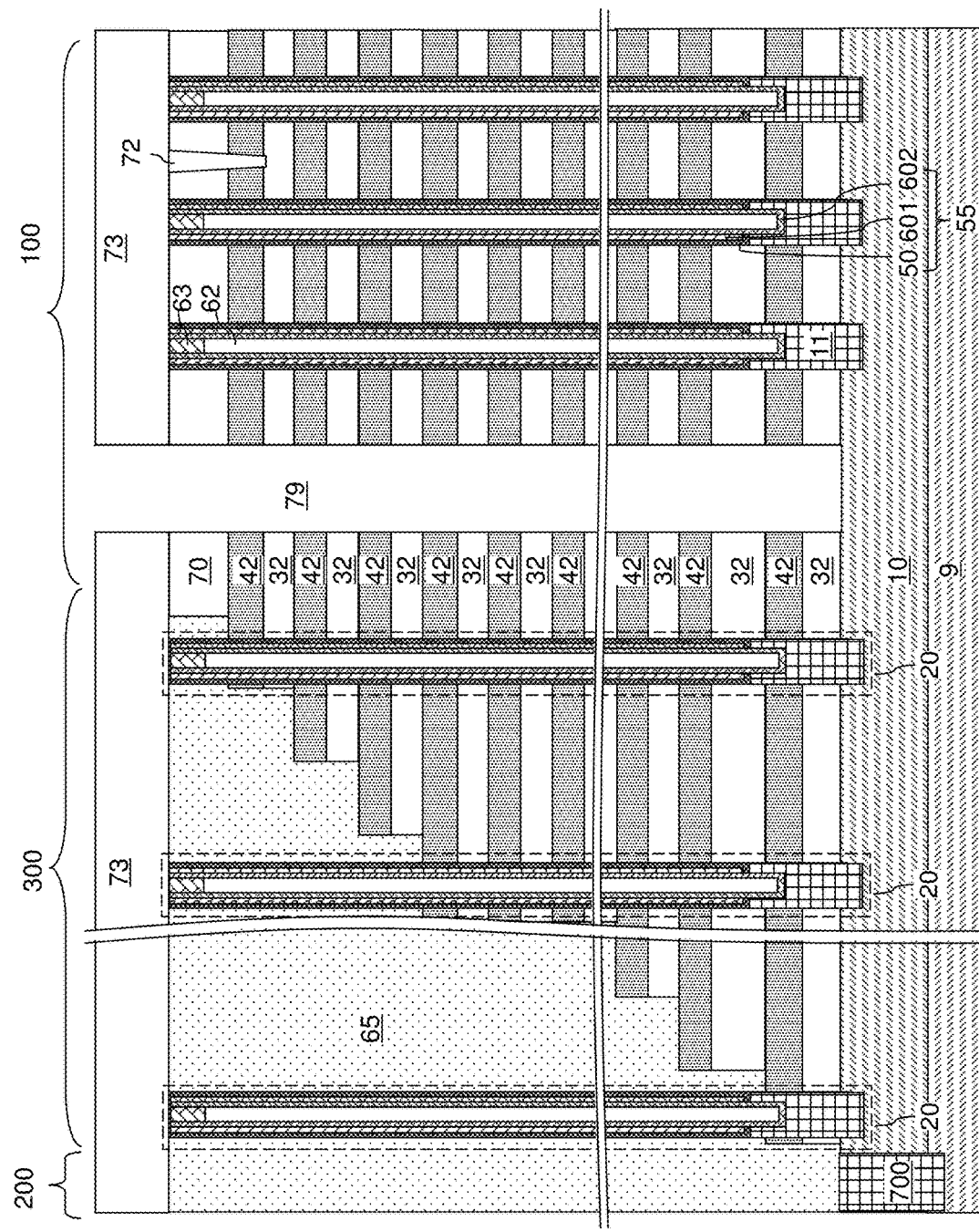
FIG. 7A is a schematic vertical cross-sectional view of the exemplary structure after formation of a backside trench according to an embodiment of the present disclosure.
Figure 7B:
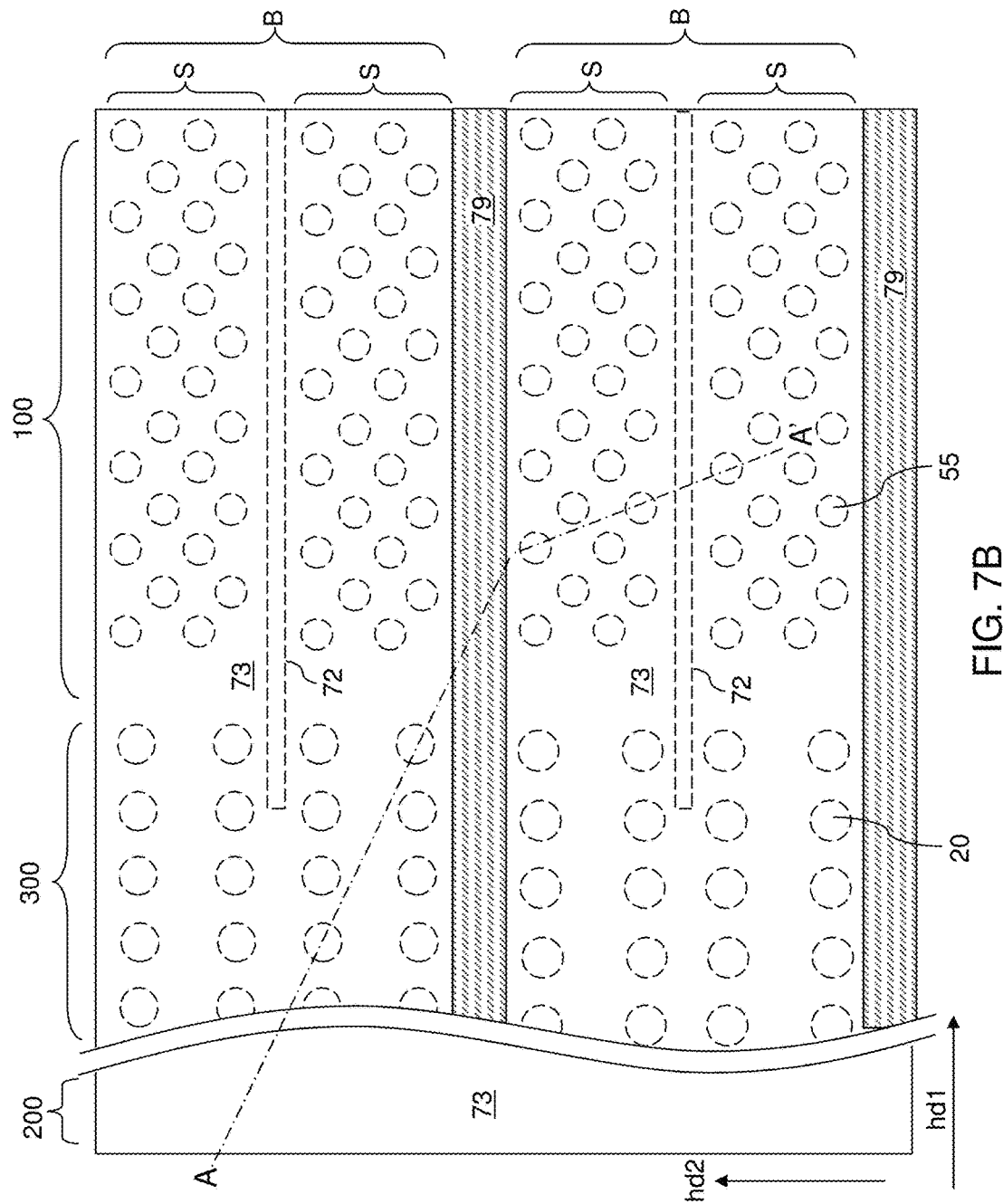
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing. In one embodiment, the backside trenches 79 can laterally extend along a first horizontal direction hd1 (e.g., word line direction) through the continuous alternating stack of the continuous insulating layers 32 and the continuous sacrificial material layer 42. The backside trenches 79 divide the areas of the memory array regions 100 and the contact regions 300 into blocks B. In other words, each block B can be separated from a neighboring block B by a backside trench 79.

The continuous alternating stack of the continuous insulating layers 32 and the continuous sacrificial material layer 42 is divided into multiple in-process vertically alternating stacks, each of which includes respective remaining portions of the continuous insulating layer 32 and respective remaining portions of the continuous sacrificial material layer 42. Remaining portions of the continuous insulating layers 32 that laterally extend along the first horizontal direction hd1 and having a uniform width along the second horizontal direction hd2 (e.g., bit line direction) are herein referred to as insulating strips 32. Remaining portions of the continuous sacrificial material layers 42 that laterally extend along the first horizontal direction hd1 and having a uniform width along the second horizontal direction hd2 are herein referred to as sacrificial material strips 42. Subsequently, the sacrificial material strips 42 (i.e., the remaining portions of the continuous sacrificial material layers 42) are replaced with the conductive material strips comprise electrically conductive layers (e.g., word lines and select gates) so that multiple vertically alternating stacks of insulating layers 32 and electrically conductive layers is formed.

Figure 8:
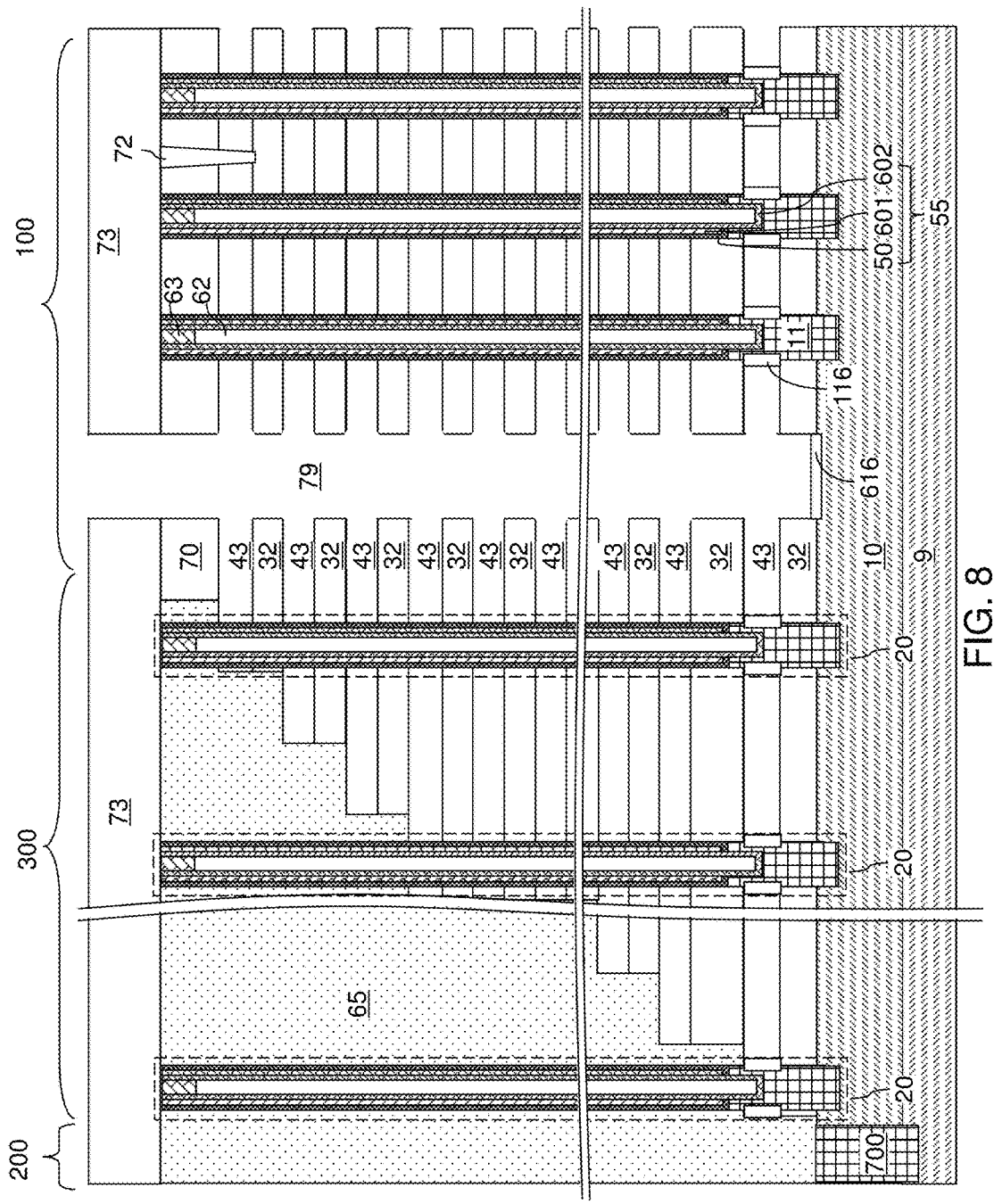
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating strips 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating strips 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating strips 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating strip 32 and a bottom surface of an overlying insulating strip 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating strips 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating strips 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
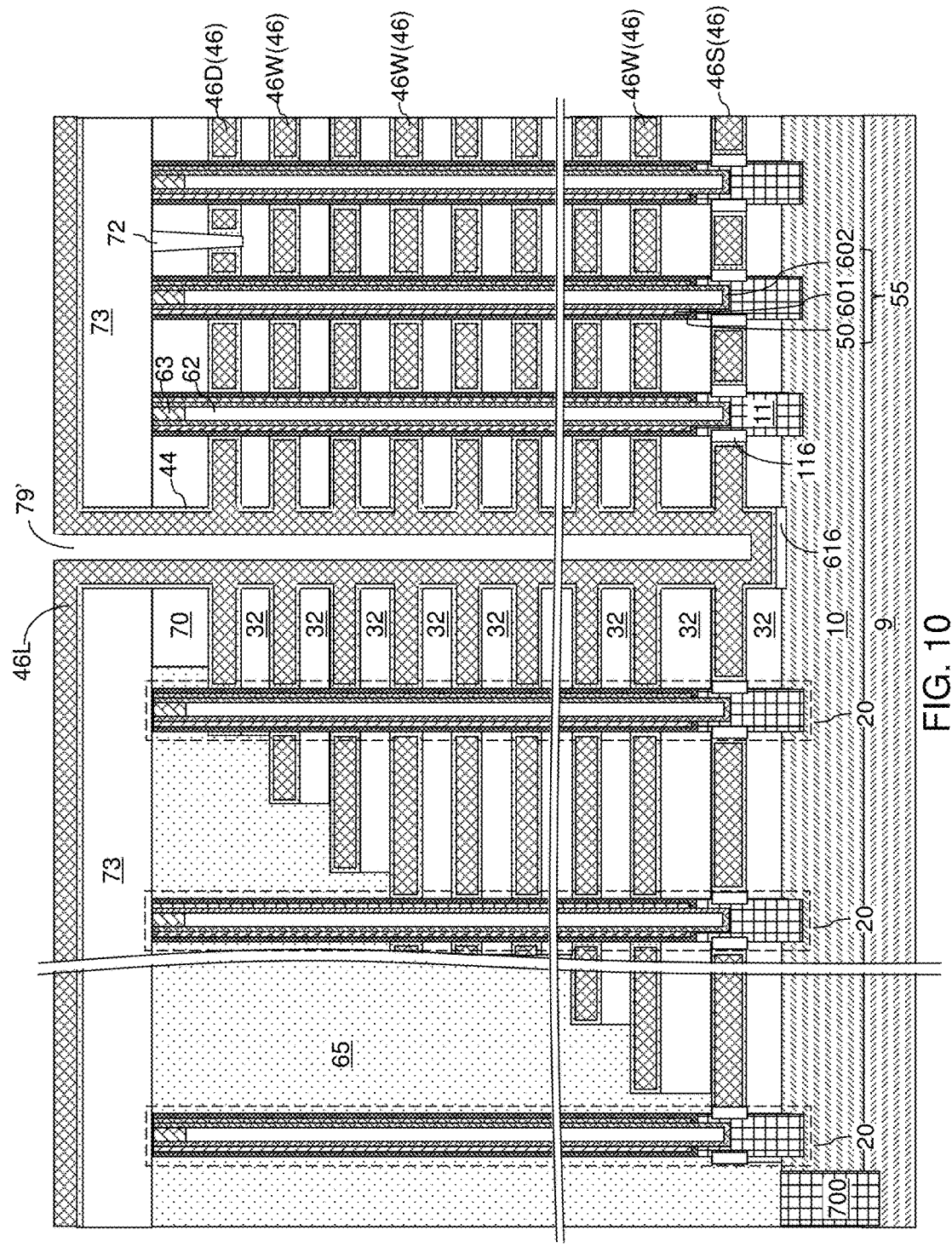
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating strips 32 and the memory stack structures 55 by the metallic barrier layer 46A, which is a metallic barrier layer that blocks diffusion of fluorine atoms therethrough.

A plurality of electrically conductive strips 46 can be formed in the plurality of backside recesses 43, and a continuous metallic material layer 46L can be formed on the sidewalls of each backside trench 79 and over the contact level dielectric layer 73. The electrically conducive strips 46 include word line electrically conductive strips 46W (i.e., word lines/control gates) that are formed at word line levels, i.e., levels that are common for each block B. The electrically conductive strips further include drain select electrically conductive strips 46D (i.e., drain select gates) that are formed at drain select levels, e.g., levels that are common only for each sub-block S at the top of the stack. The electrically conductive strips further include source select electrically conductive strips 46S (i.e., source select gates) that are formed at source select levels, e.g., one or more levels at the bottom of the stack. Each electrically conductive strip 46 includes a portion of the metallic barrier layer 46A and a portion of the metallic fill material layer 46B that are located between a vertically neighboring pair of dielectric material layers, such as a pair of insulating strips 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive strip 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive strip 46 laterally surrounds each tubular dielectric spacer 116 upon formation of the electrically conductive strips 46.

Figure 11:
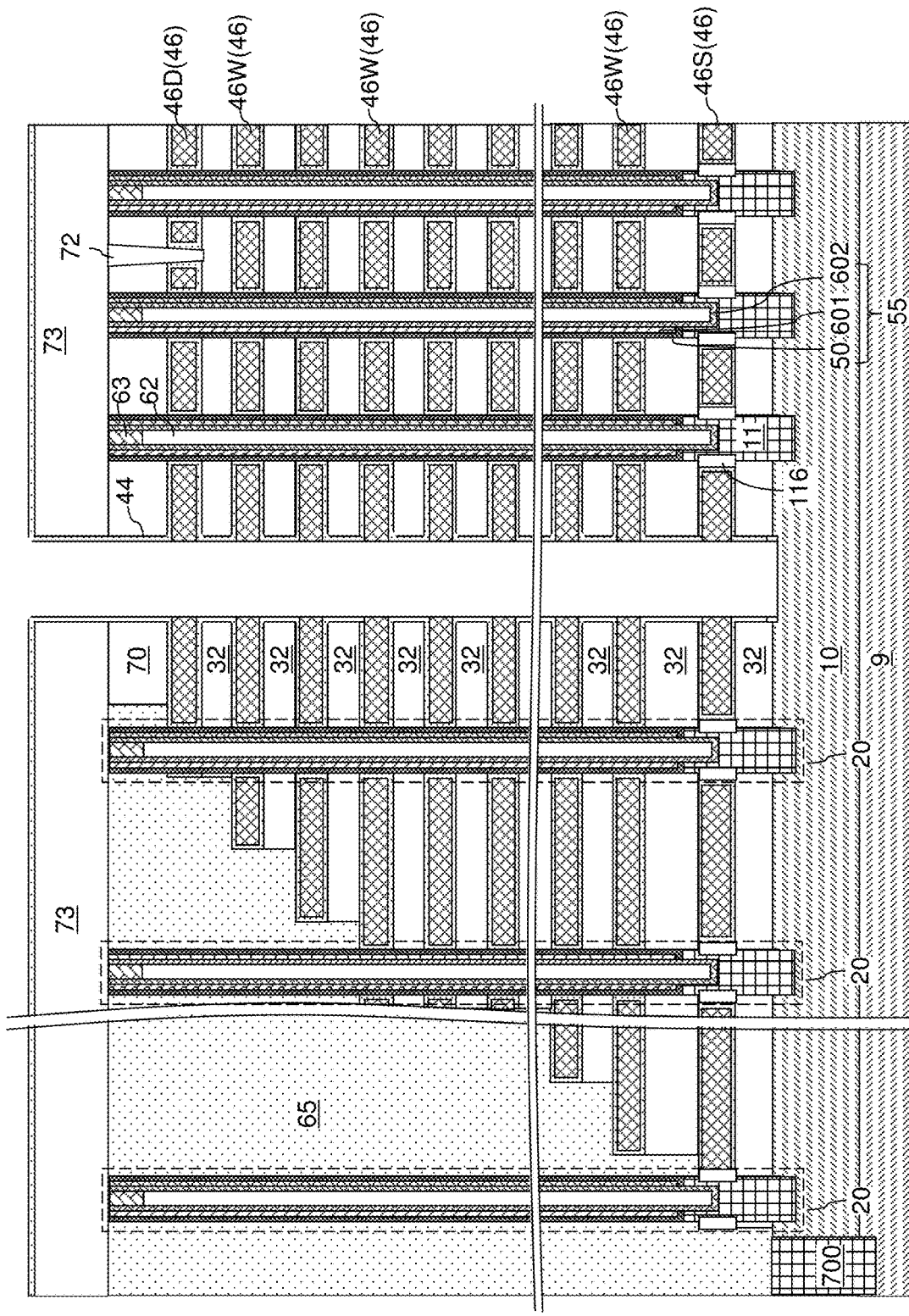
FIG. 11 is a schematic vertical cross-sectional view of the exemplary structure after removal of a deposited conductive material from within the backside trench according to an embodiment of the present disclosure.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be a conductive line structure. Thus, the sacrificial material layers 42 are replaced with the electrically conductive strips 46.

Each electrically conductive strip 46 can function as a combination of a plurality of control gate electrodes located at a same level and a word line electrically interconnecting, i.e., electrically shorting, the plurality of control gate electrodes located at the same level. The plurality of control gate electrodes within each electrically conductive strip 46 are the control gate electrodes for the vertical memory devices including the memory stack structures 55. In other words, each electrically conductive strip 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. A backside cavity 79' is present within each backside trench 79.

Figure 12A:
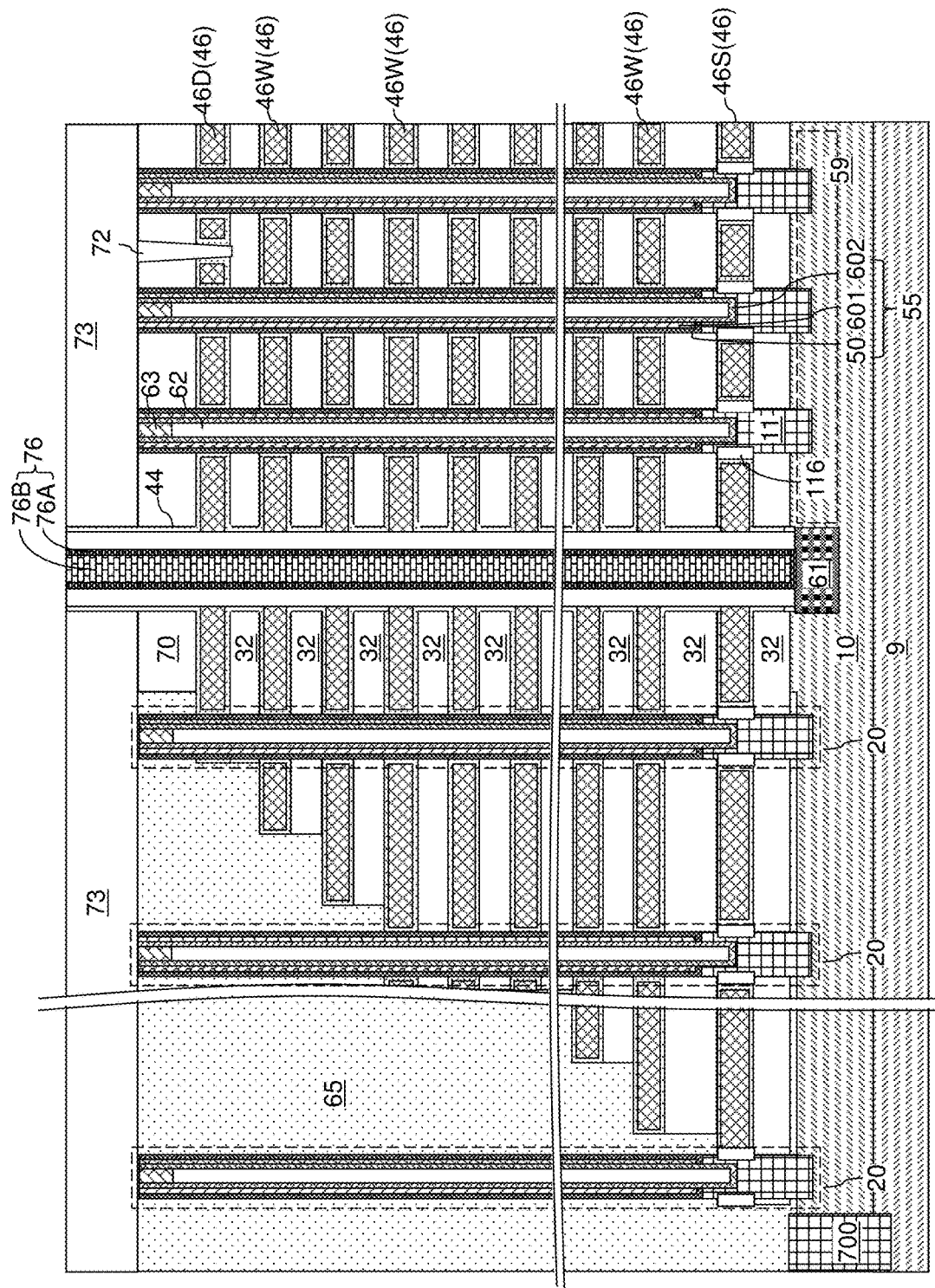
FIG. 12A is a schematic vertical cross-sectional view of the exemplary structure after formation of an insulating spacer and a backside contact structure according to an embodiment of the present disclosure.
Figure 12B:
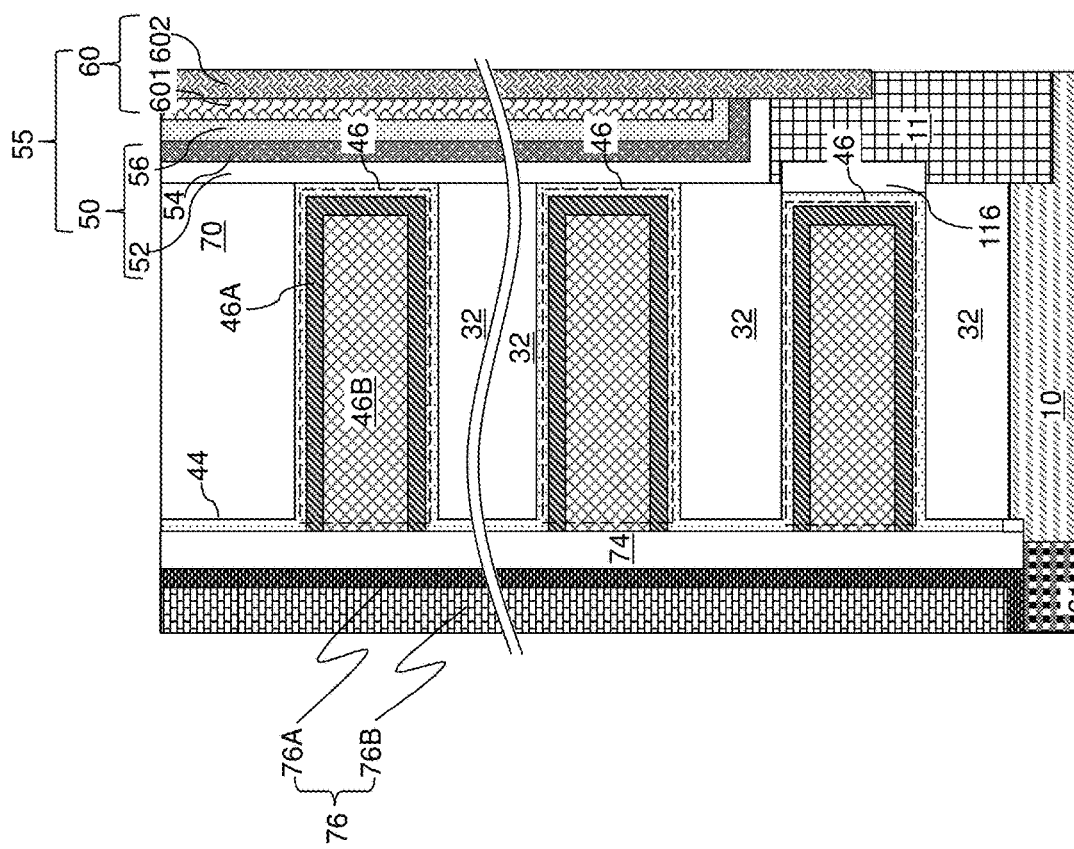
FIG. 12B is a magnified view of a region of the exemplary structure of FIG. 12A.

Referring to FIGS. 12A and 12B, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive strips 46. If a backside blocking dielectric layer 44 is not employed, the insulating material layer can be formed directly on sidewalls of the insulating strips 32 and directly on sidewalls of the electrically conductive strips 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive strip 46 provided upon formation of the electrically conductive strips 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. The backside contact via structure 76 comprises a source electrode which contacts the source region 61 in the substrate. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44. Each portion of the insulating strips 32 can be an insulating strip that laterally extends along the first horizontal direction hd1 and having a uniform width along the second horizontal direction hd2. Each portion of the electrically conductive strips 46 can be an electrically conductive strip that laterally extends along the first horizontal direction and having a uniform width along the second horizontal direction hd2. Multiple vertically alternating stacks of insulating strips 32 and electrically conductive strips 46 are formed located over the substrate (9, 10) such that each of the multiple vertically alternating stacks (32, 46) is laterally spaced among one another (i.e., the stacks are laterally spaced apart). The memory stack structures 55 extend through a respective one of the multiple vertically alternating stacks (32, 46). Each of the memory stack structures 55 comprises a memory film 50 and a vertical semiconductor channel 60 contacting an inner sidewall of the memory film 50.

Figure 13A:
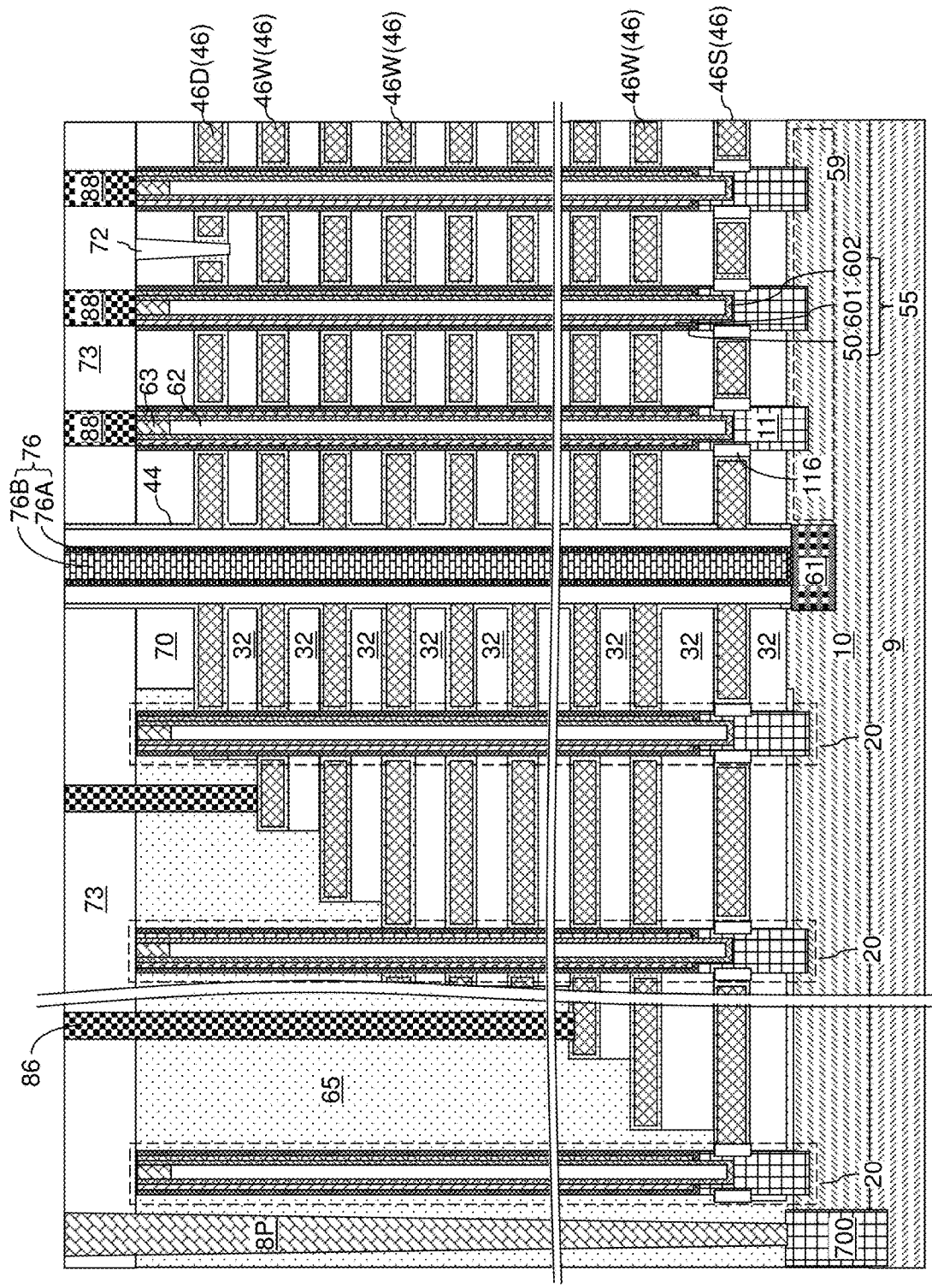
FIG. 13A is a schematic vertical cross-sectional view of the exemplary structure after formation of additional contact via structures according to an embodiment of the present disclosure.
Figure 13B:
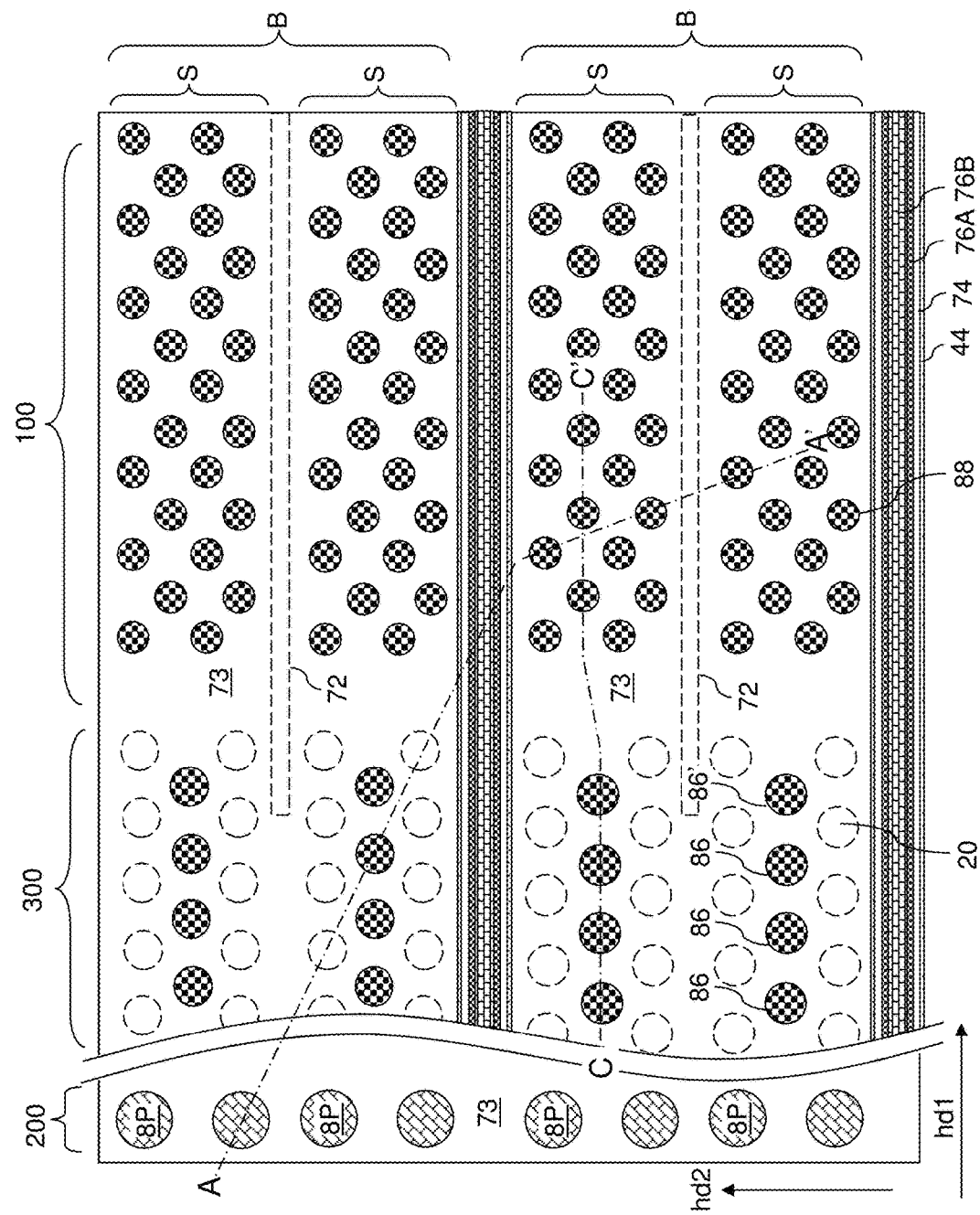
FIG. 13B is a top-down view of the exemplary structure of FIG. 13A. The vertical plane A-A' is the plane of the schematic vertical cross-sectional view of FIG. 13A.
Figure 13C:
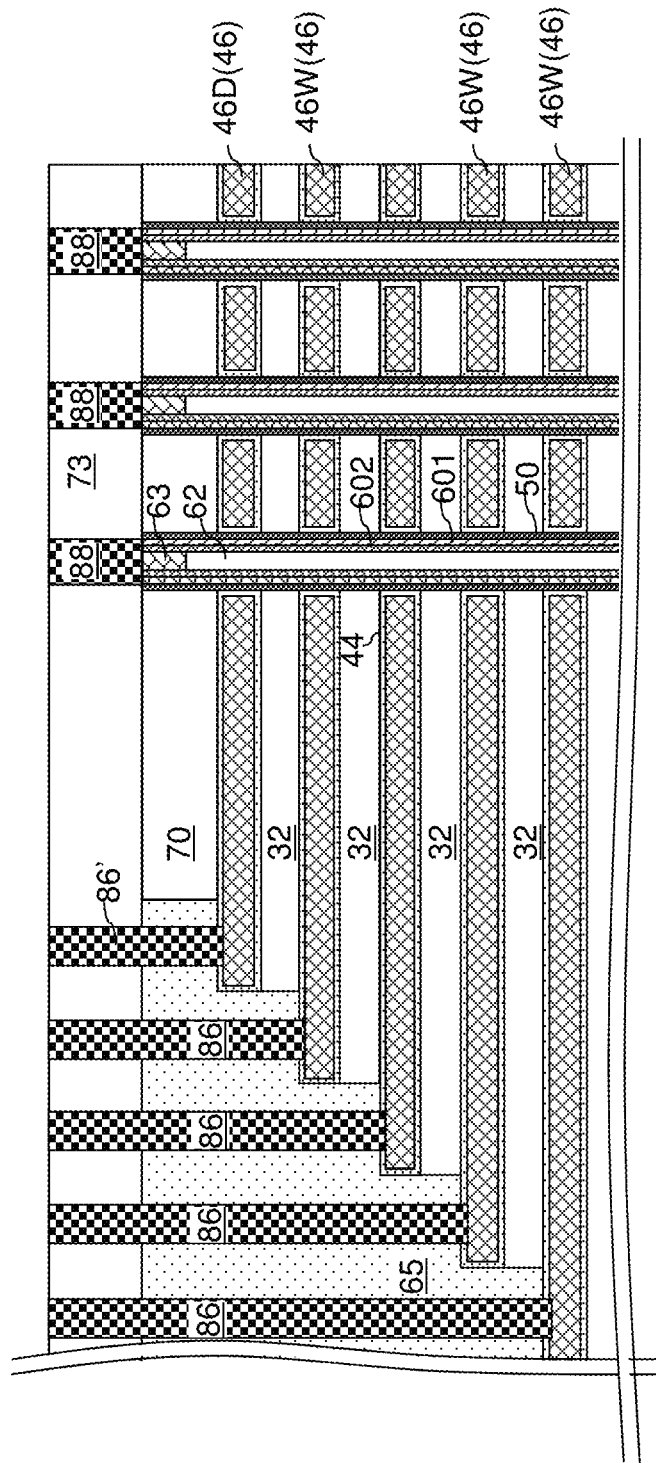
FIG. 13C is a schematic vertical cross-sectional view of the exemplary structure of FIGS. 13A and 13B along the vertical plane C-C' of FIG. 13B.

Referring to FIGS. 13A-13C, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive strips 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

The electrically conductive strips 46 can include drain select level electrically conductive strips 46D, which are located at the level of the drain select level isolation structures 72. Thus, the drain select level electrically conductive strips 46D can be laterally isolated among one another by the drain select level isolation structures 72 and the insulating spacers 74. The word line contact via structures contacting a top surface of a respective one of the electrically conductive strips 46 that function as word lines (i.e., strips 46W), which include a subset of the electrically conductive strips 46 that are not the drain select level electrically conductive strips 46D or the source select level electrically conductive strips 46S. Drain select electrode contact via structures 86' can contact top surfaces of the drain select level electrically conductive strips 46D (i.e., the drain select gates). Source select electrode contact via structures (not shown) can contact top surfaces of the source select level electrically conductive strips 46S (i.e., the source select gates).

In one embodiment, multiple vertically alternating stacks of insulating strips 32 and electrically conductive strips 46 are formed with a respective terrace region. Each electrically conductive strip 46 has a monotonically decreasing lateral extent as a function of a distance from the substrate (9, 10). Each of the terrace regions includes respective stepped surfaces that continuously extend from a bottommost layer within a respective vertically alternating stack (32, 46) to a topmost layer within the respective alternating stack (32, 46). Each of the word line contact via structures 86 can be formed on a top surface of a respective one of the word line electrically conductive strips 46W within the terrace regions.

Figure 14:
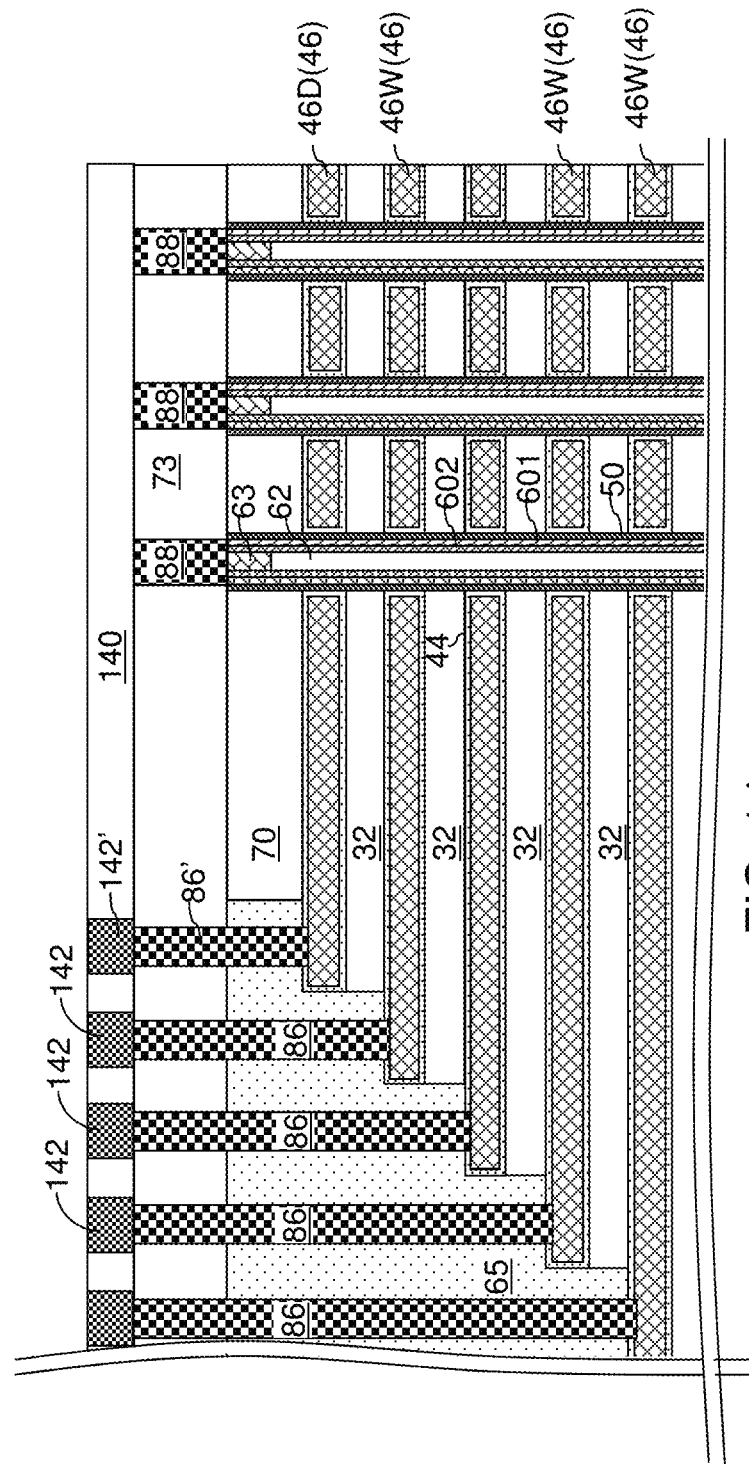
FIG. 14 is a schematic vertical cross-sectional view of the exemplary structure after formation of a contact pad level dielectric layer and contact pad structures according to an embodiment of the present disclosure.

Referring to FIG. 14, a contact pad level dielectric layer 140 including a dielectric material such as silicon oxide can be formed over the contact pad level dielectric layer 73. Various contact pad structures (142, 142') can be formed in the contact pad level dielectric layer 140 and directly on underlying contact via structures (86, 86'). For example, word line via contact pad structures 142 can be formed on the word line contact via structures 86, and an optional drain select via contact pad structures 142' can be formed on the drain select electrode contact via structure 86'. Alternatively, the drain select via contact pad structures 142' can be omitted.

Figure 15A:
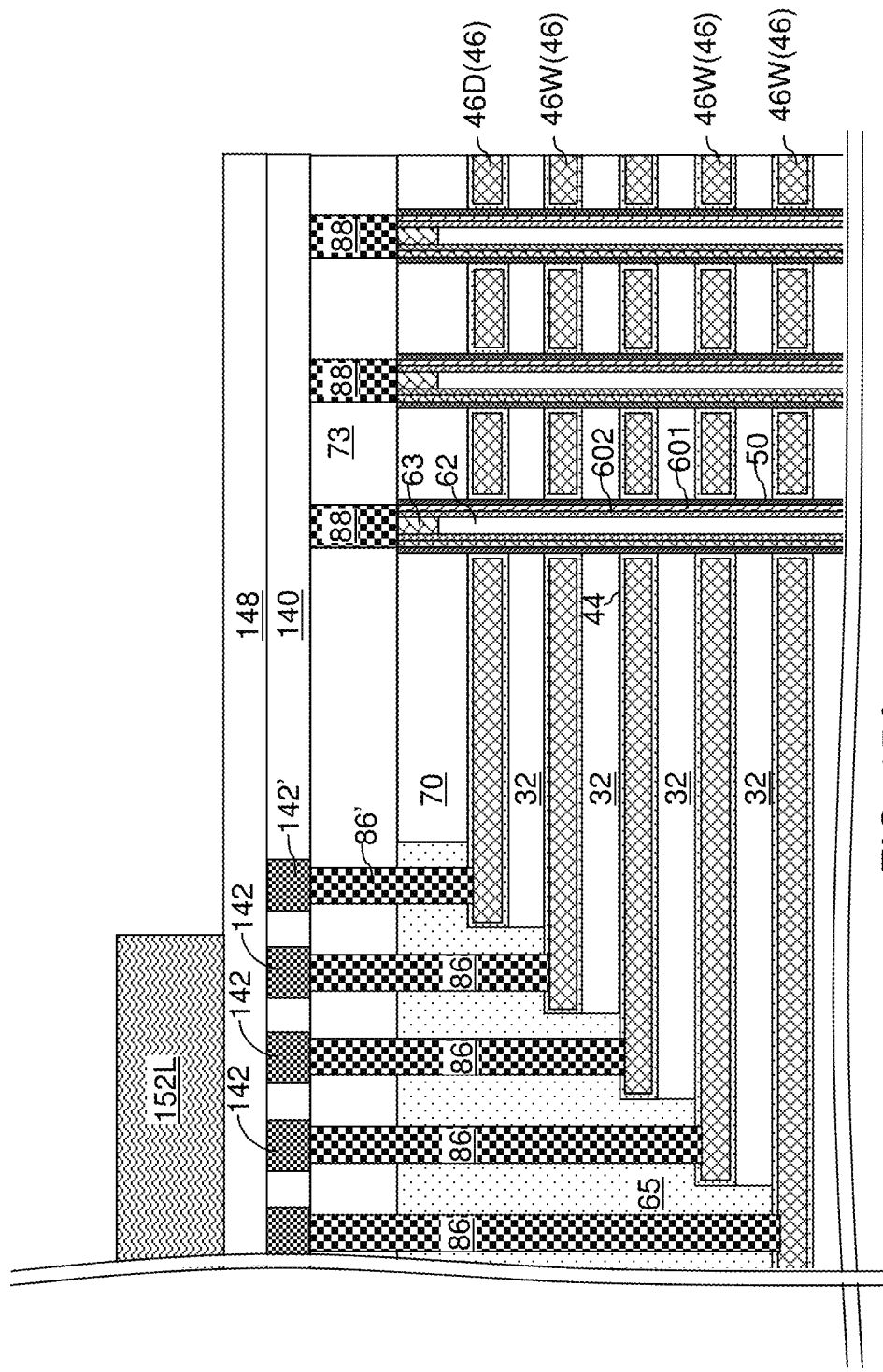
FIG. 15A is a schematic vertical cross-sectional view of the exemplary structure after formation of a first transistor level dielectric layer and patterned gate electrode layers according to an embodiment of the present disclosure.
Figure 15B:
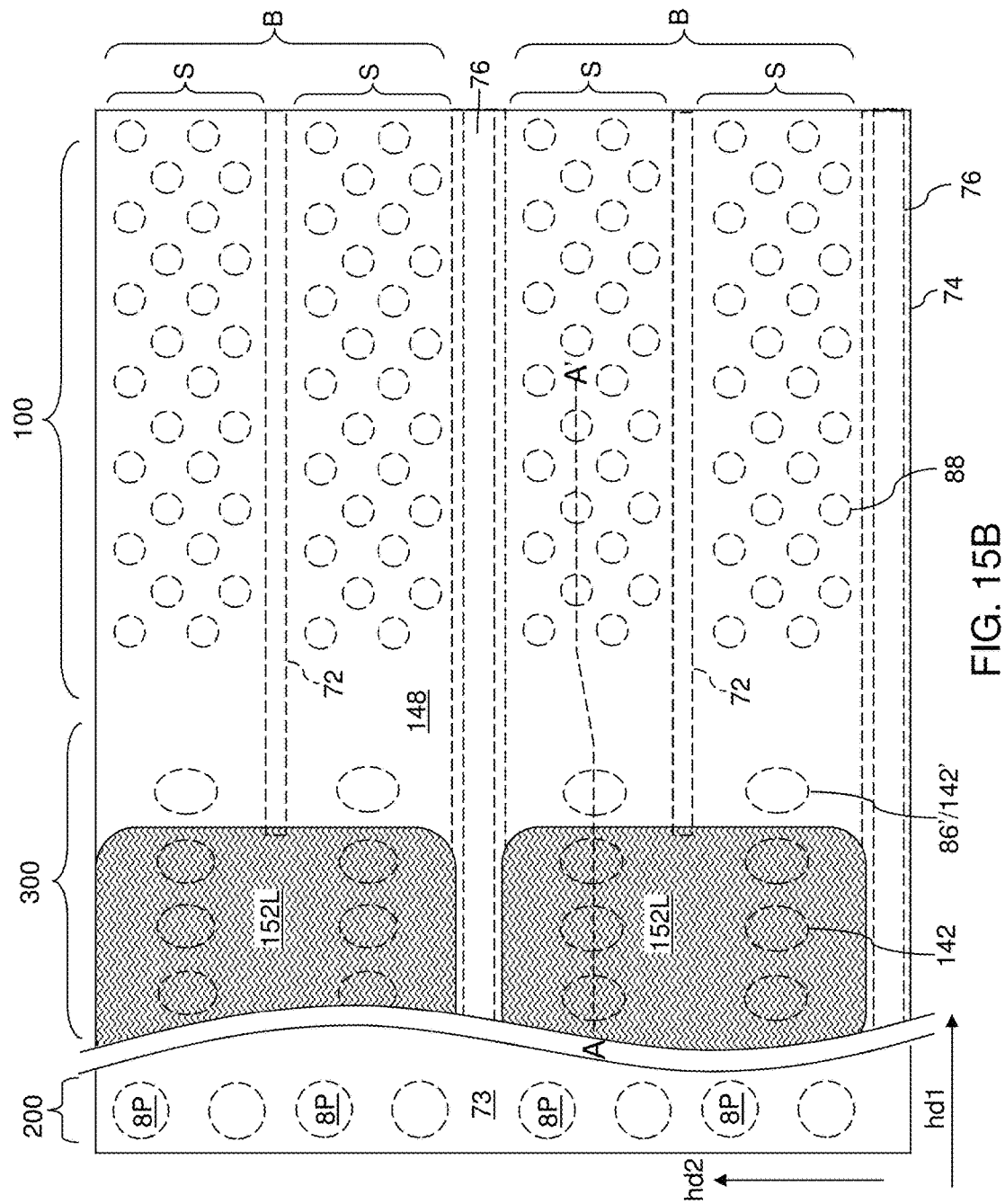
FIG. 15B is a top-down view of the exemplary structure of FIG. 15A. The vertical plane A-A' is the plane of the schematic vertical cross-sectional view of FIG. 15A.

Referring to FIGS. 15A and 15B, a first transistor level dielectric layer 148 including a dielectric material such as silicon oxide can be formed over the contact pad level dielectric layer 140. The thickness of the first transistor level dielectric layer 148 can be in a range from 10 nm to 200 nm, such as from 20 nm to 100 nm, although lesser and greater thicknesses can also be employed.

A gate electrode material is subsequently deposited and lithographically patterned (for example, by application and patterning of a photoresist layer and transfer of the pattern in the photoresist layer through the gate electrode material) to form patterned gate electrode layers 152L. Each patterned gate electrode layer 152L can continuously cover the areas of a group of word line via contact pad structures 142 that overlie a plurality of alternating stacks of insulating strips 32 and electrically conductive strips 46. However, in one embodiment, each patterned gate electrode layer 152L does not cover or extend over the optional drain select via contact pad structures 142' and the drain select electrode contact via structures 86'. In other words, each patterned gate electrode layer 152L can laterally extend along the second horizontal direction hd2 over multiple sub-blocks S. The patterned gate electrode layers 152L can include a doped semiconductor material (such as doped polysilicon) and/or a metallic material (such as TiN). The thickness of the patterned gate electrode layers 152L can be in a range from 50 nm to 500 nm, such as from 100 nm to 250 nm, although lesser and greater thicknesses can also be employed.

Figure 16:
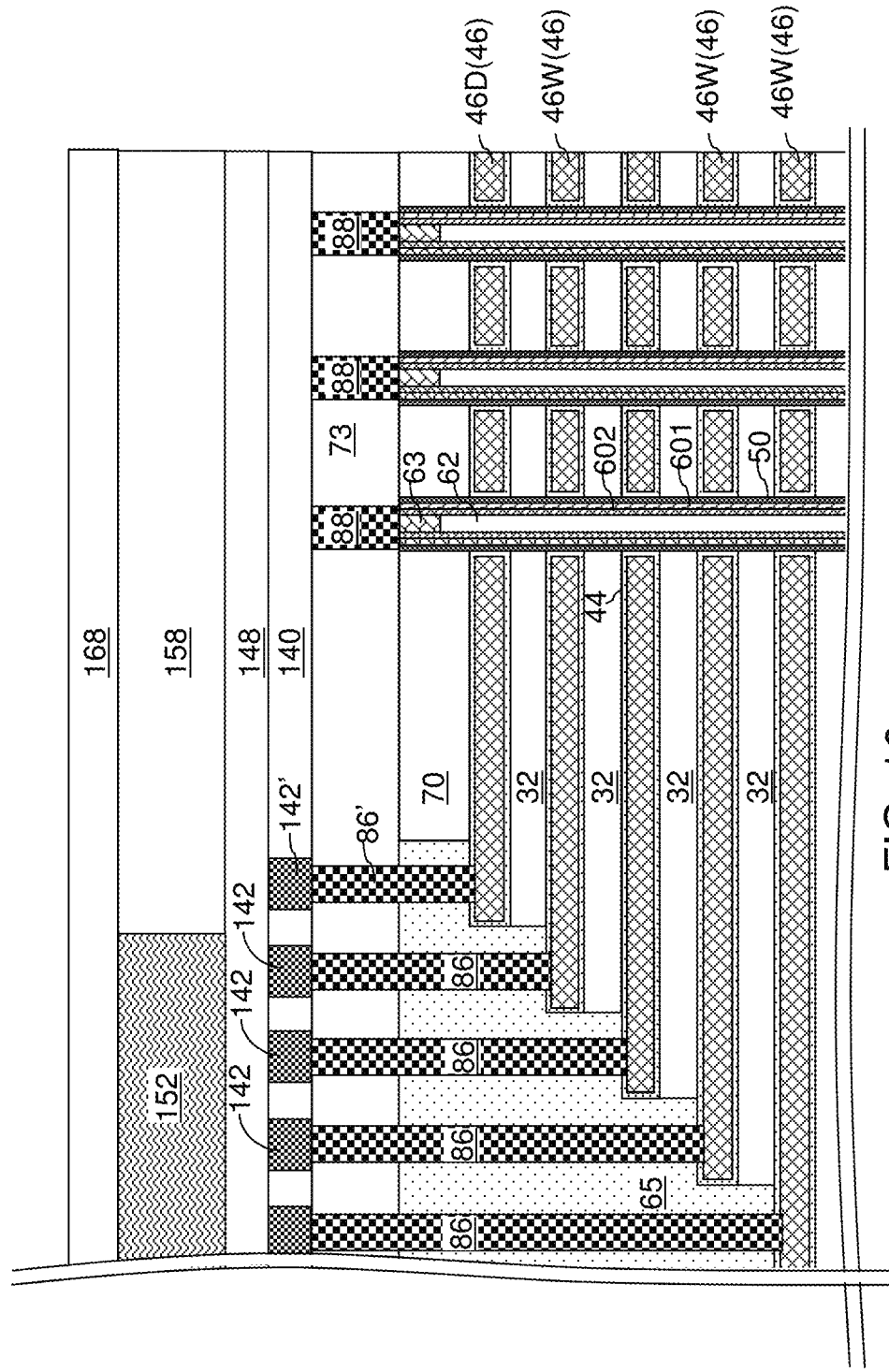
FIG. 16 is a schematic vertical cross-sectional view of the exemplary structure after formation of a second transistor level dielectric layer and a third transistor level dielectric layer according to an embodiment of the present disclosure.

Referring to FIG. 16, a second transistor level dielectric layer 158 can be formed at the level of the patterned gate electrode layers 152L by deposition of a dielectric material such as silicon oxide. The top surface of the second transistor level dielectric layer 158 can be planarized by a planarization process such as chemical mechanical planarization. A third transistor level dielectric layer 168 can be formed above the level of the patterned gate electrode layers 152L by deposition of a dielectric material such as silicon oxide. The thickness of the third transistor level dielectric layer 168 can be in a range from 10 nm to 200 nm, such as from 20 nm to 100 nm, although lesser and greater thicknesses can also be employed. The second and third transistor level dielectric layers (158, 168) can be formed as two distinct dielectric material layers, or can be formed as a single dielectric material layer.

Figure 17A:
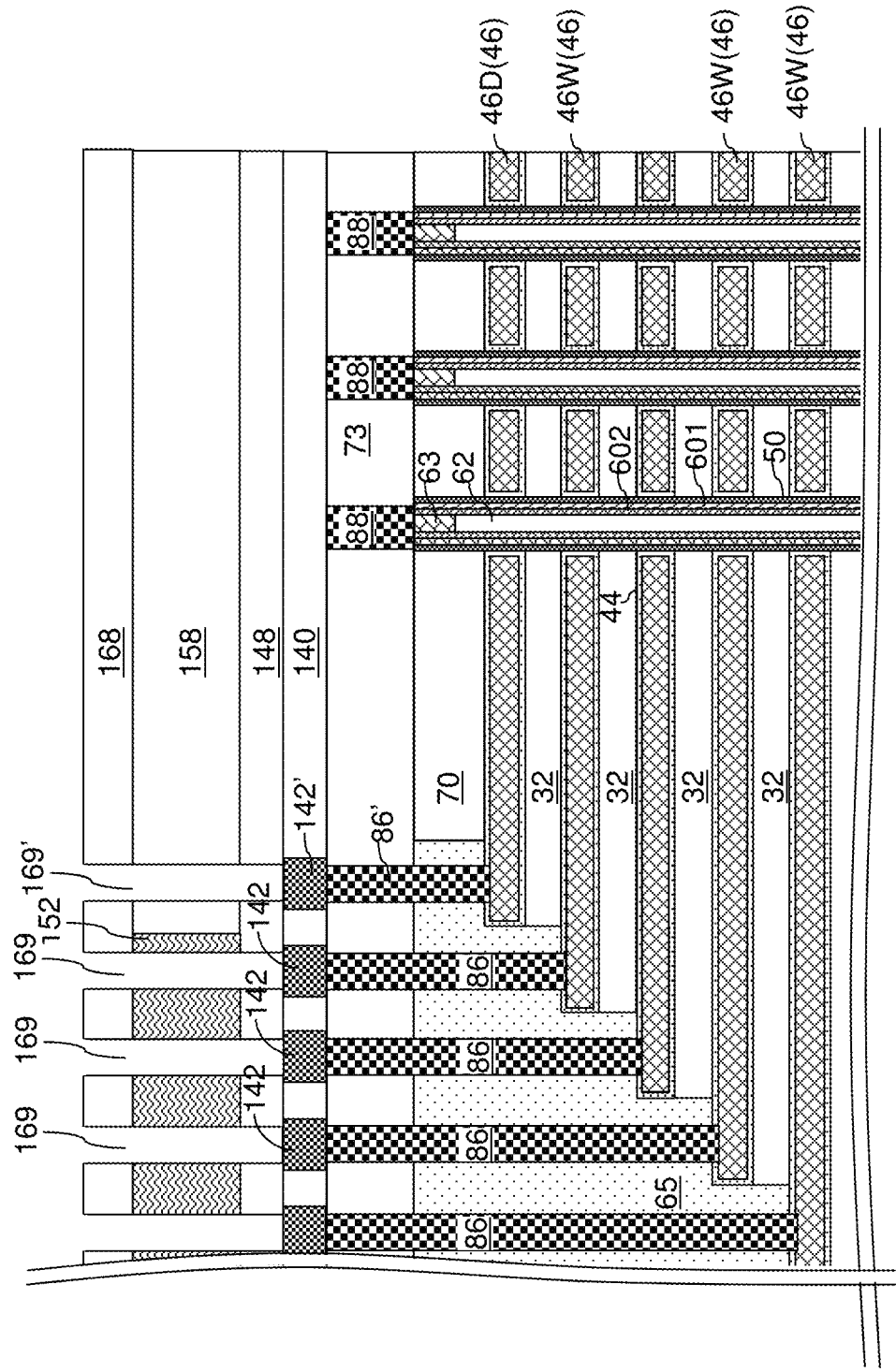
FIG. 17A is a schematic vertical cross-sectional view of the exemplary structure after formation of channel openings according to an embodiment of the present disclosure.
Figure 17B:
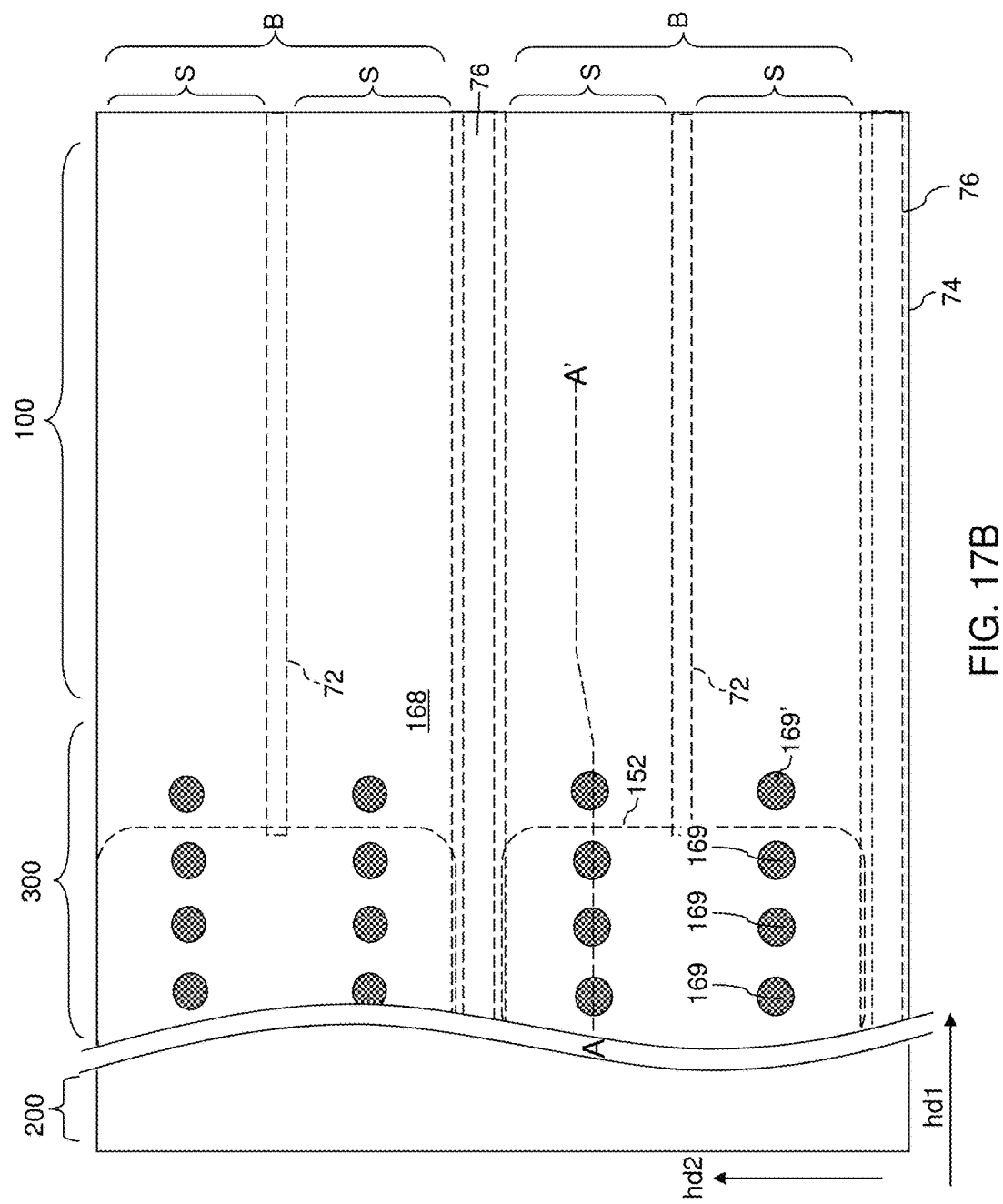
FIG. 17B is a top-down view of the exemplary structure of FIG. 17A. The vertical plane A-A' is the plane of the schematic vertical cross-sectional view of FIG. 17A.

Referring to FIGS. 17A and 17B, channel openings 169 and connection openings 169' are formed. For example, a photoresist layer (not shown) can be applied and lithographically patterned to form opening therein. The pattern in the photoresist layer can be transferred through the first, second, and third transistor level dielectric layers (148, 158, 168) and through the patterned gate electrode layers 152L by an anisotropic etch. The photoresist layer can be subsequently removed, for example, by ashing. Each channel opening 169 is formed through one of the patterned gate electrode layers 152L. Each connection opening 169' is laterally spaced from the gate electrode layers 152L, and extends only through the first, second, and third transistor level dielectric layers (148, 158, 168). A top surface of a respective one of the word line via contact pad structures 142 is physically exposed at the bottom of each channel opening 169. A top surface of a respective one of the drain select via contact pads 142' is physically exposed at the bottom of each connection opening 169'.

Each remaining portion of the patterned gate electrode layers 152L constitutes a gate electrode 152. A sidewall of a gate electrode 152 is physically exposed around each channel opening 169, and laterally encircles (i.e., surrounds with an azimuthal angle coverage of 360 degrees) the channel openings 169. Each gate electrode 152 laterally surrounds a plurality of channel openings 169 located within a plurality of sub-blocks S. The gate electrodes 152 are spaced from the connection openings 169', and thus, sidewalls of the gate electrodes 152 are not physically exposed in the connection openings 169'.

Figure 18:
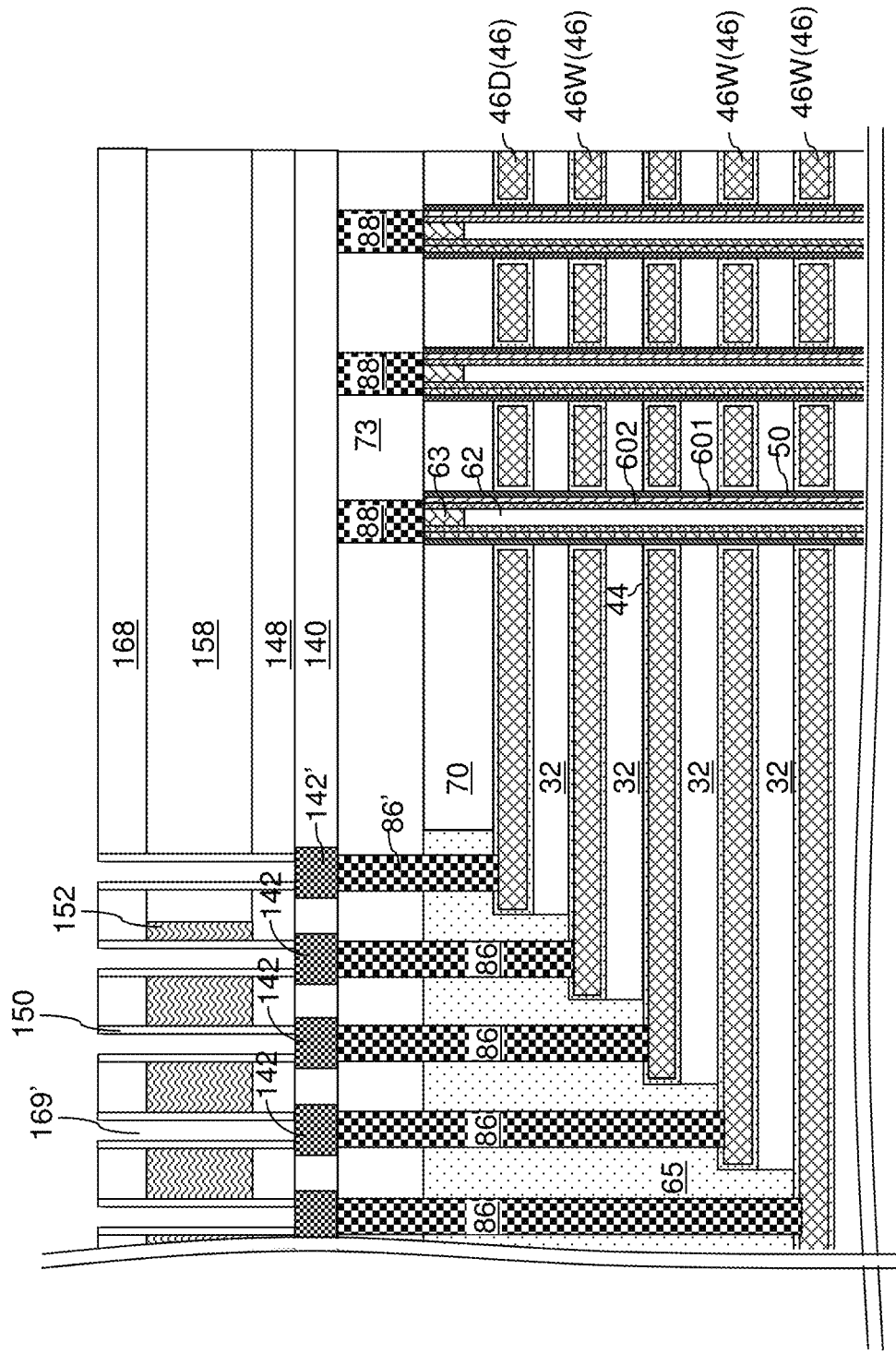
FIG. 18 is a schematic vertical cross-sectional view of the exemplary structure after formation of gate dielectrics according to an embodiment of the present disclosure.

Referring to FIG. 18, gate dielectrics 150 are formed on the sidewalls of the channel openings 169 and the connection openings 169'. The gate dielectrics 150 can be formed by conformal deposition and anisotropic etch of a conformal dielectric material layer such as a silicon oxide layer. If the gate electrodes 152 include a doped semiconductor material such as doped polysilicon, the gate dielectrics 150 can be formed partly or entirely by converting surface portions of the gate electrodes 152 into cylindrical dielectric material portions around each of the channel openings 169 and the connection openings 169'. In this case, the gate dielectrics 150 can include silicon oxide and/or silicon oxynitride. The thickness of each gate dielectric 150 can be in a range from 1 nm to 10 nm, although lesser and greater thicknesses can also be employed.

Figure 19:
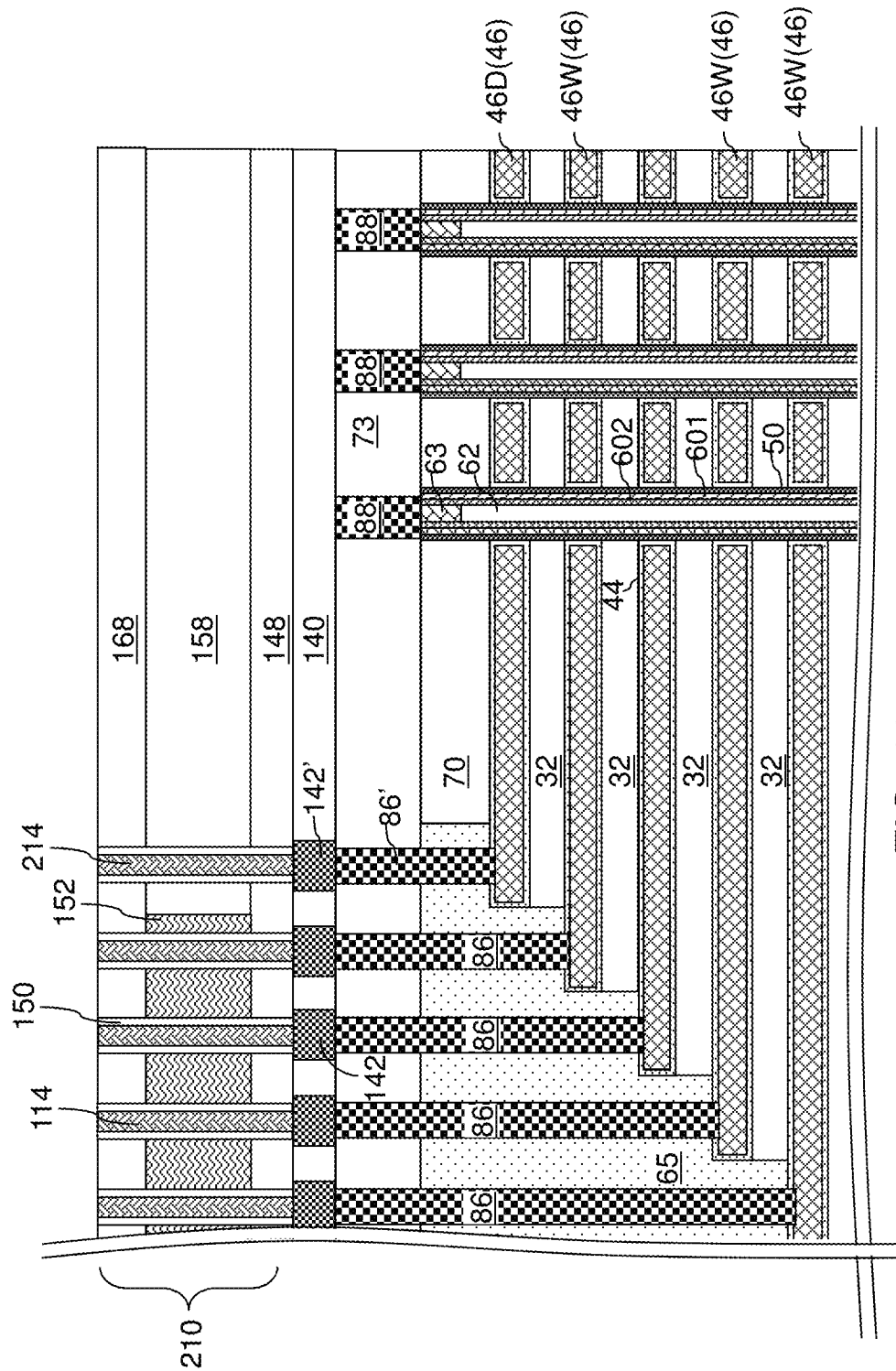
FIG. 19 is a schematic vertical cross-sectional view of the exemplary structure after formation of semiconductor pillar structures according to an embodiment of the present disclosure.

Referring to FIG. 19, a doped semiconductor material is deposited in the remaining volumes of the channel openings 169 and the connection openings 169' by a conformal deposition process. The doped semiconductor material can include, for example, doped polysilicon, doped amorphous silicon (which can be subsequently annealed and converted into polysilicon), a doped silicon-germanium alloy, or a doped compound semiconductor material. The dopants in the doped semiconductor material can be p-type dopants such as boron, or can be n-type dopants such as phosphor or arsenic. The atomic concentration of the dopants in the doped semiconductor material can be in a range from $1.0 \times 10^{14}/cm^3$ to $1.0 \times 10^{18}/cm^3$, such as from $1.0 \times 10^{15}/cm^3$ to $3.0 \times 10^{17}/cm^3$, although lesser and greater dopant concentrations can also be employed. Excess portions of the doped semiconductor material can be removed from above the horizontal plane including the top surface of the third transistor level dielectric layer 168 by a planarization process such as chemical mechanical planarization and/or a recess etch process.

Each remaining portion of the doped semiconductor material in the channel openings 169 constitutes a semiconductor channel 114, which is a semiconductor pillar structure having a pillar shape. In one embodiment, each semiconductor channel 114 can have a same horizontal cross-sectional shape that is invariant with translation along the vertical direction. Each remaining portion of the doped semiconductor material in the connection openings constitutes a transistor level connecting via structure 214, which is a semiconductor pillar structure having a pillar shape. In one embodiment, each transistor level connecting via structure 214 can have a same horizontal cross-sectional shape that is invariant with translation along the vertical direction.

Figure 23A:
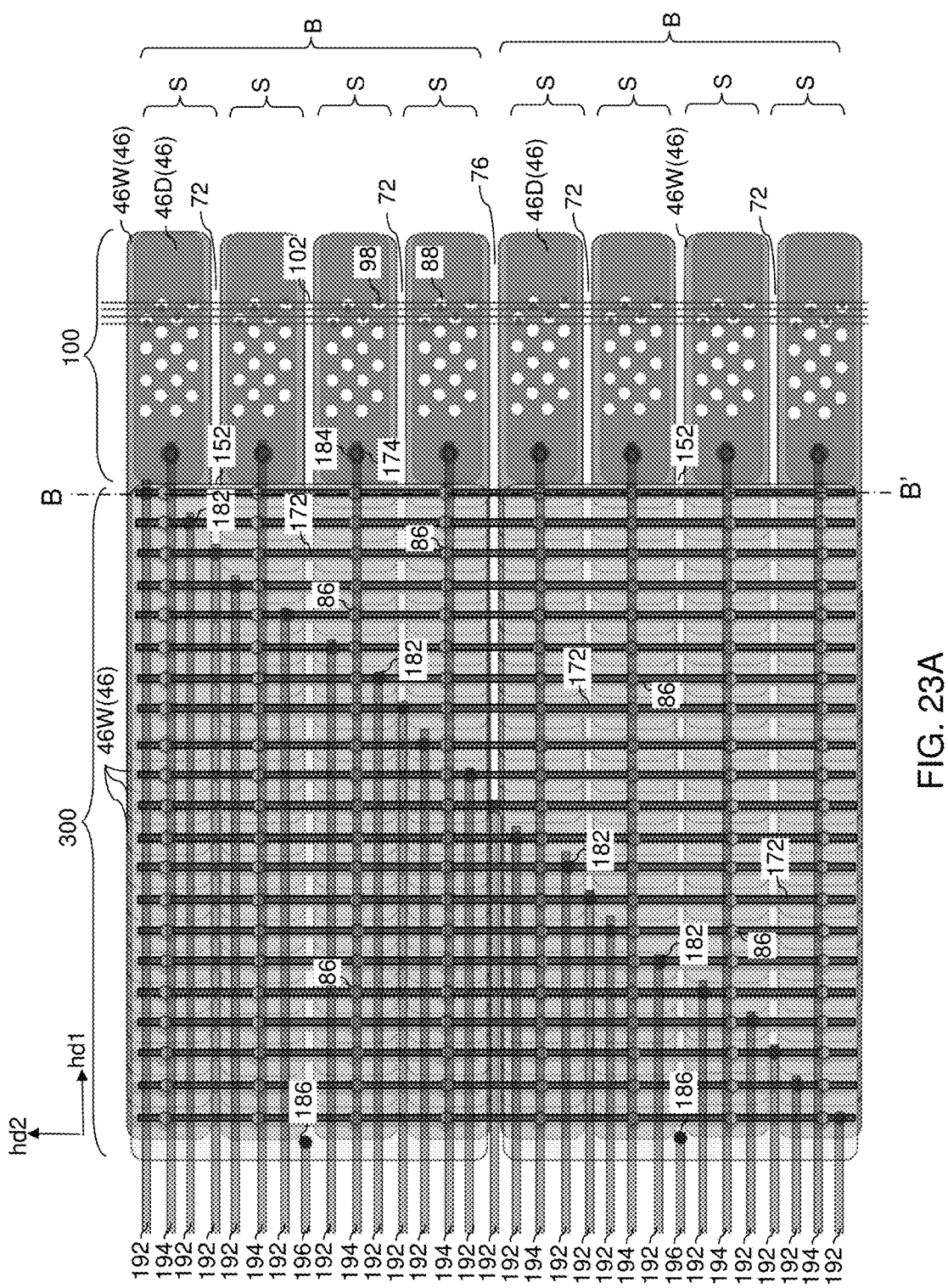
FIG. 23A is a top-down view of another configuration of the exemplary structure at the processing steps of FIGS. 22A-22C.
Figure 23B:
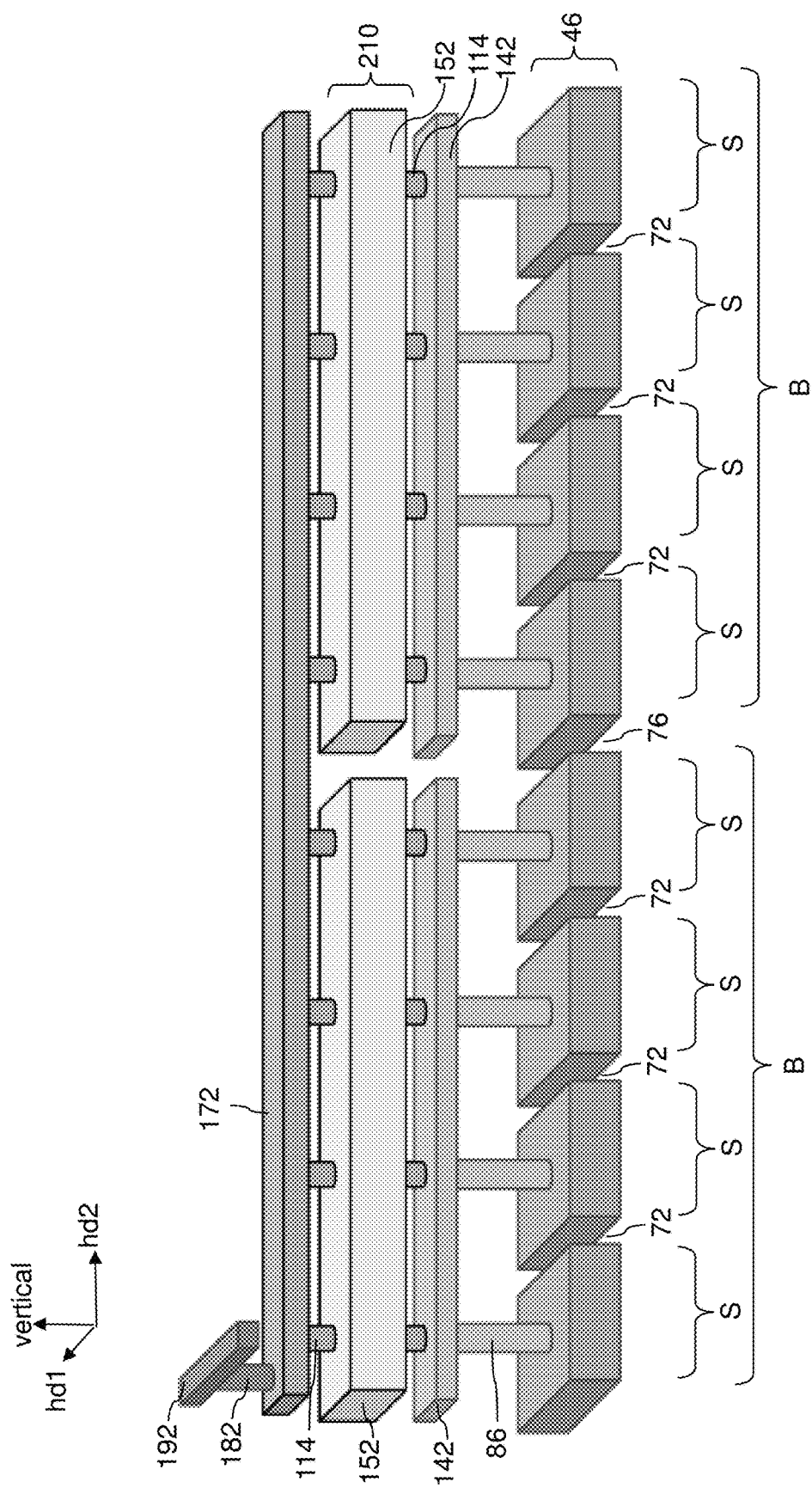
FIG. 23B is a schematic perspective cross-sectional view of the exemplary structure of FIG. 23A. The vertical plane B-B' of FIG. 23A is the plane of the schematic cross-sectional view at the front of FIG. 23B.

Field effect transistors 210 can be formed over the word line contact via structures 86. Each field effect transistor can comprise a semiconductor pillar structure that includes a semiconductor channel 114. Each semiconductor channel is laterally surrounded by a gate dielectric 150 and gate electrode 152. In one embodiment, each of the gate electrodes 152 laterally surrounds a respective subset of the semiconductor pillar structures (which comprise the semiconductor channels 114) that extends over at least two of the multiple vertically alternating stacks of insulating strips 32 and electrically conductive strips 46, i.e., over at least two sub-blocks S. Each sub-block S can include a respective alternating stack of insulating strips 32 and electrically conductive strips 46. In one embodiment, bottom ends of the semiconductor pillar structures (which comprise the semiconductor channels 114) can be electrically connected to a respective word line contact via structure 86, as shown in FIG. 23B and discussed in more detail below.

Figure 20:
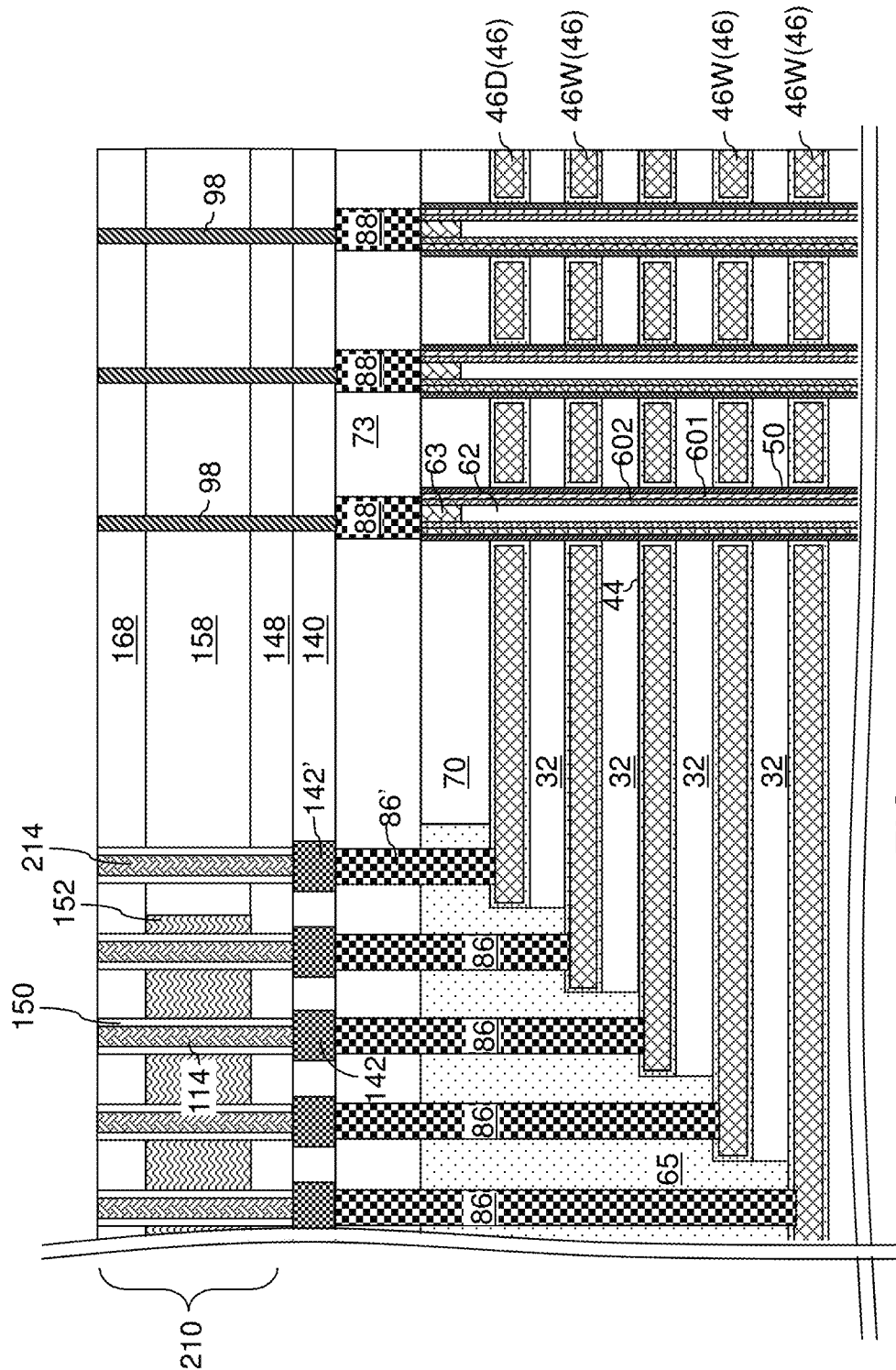
FIG. 20 is a schematic vertical cross-sectional view of the exemplary structure after formation of array contact via structures according to an embodiment of the present disclosure.

Referring to FIG. 20, array contact via structures 98 can be optionally formed through the transistor level dielectric layers (148, 158, 168) and the contact pad level dielectric layer 140 and in contact with the drain contact via structures 88. The array contact via structures (e.g., bit line contact via structures) 98 includes at least one metallic material such as a combination of a titanium nitride liner and a tungsten fill material. The array contact via structures 98 can have a pillar shape. In one embodiment, the pillar shapes of the array contact via structures 98 can be laterally elongated along a direction along which overlying bit lines are to be subsequently formed.

Figure 21A:
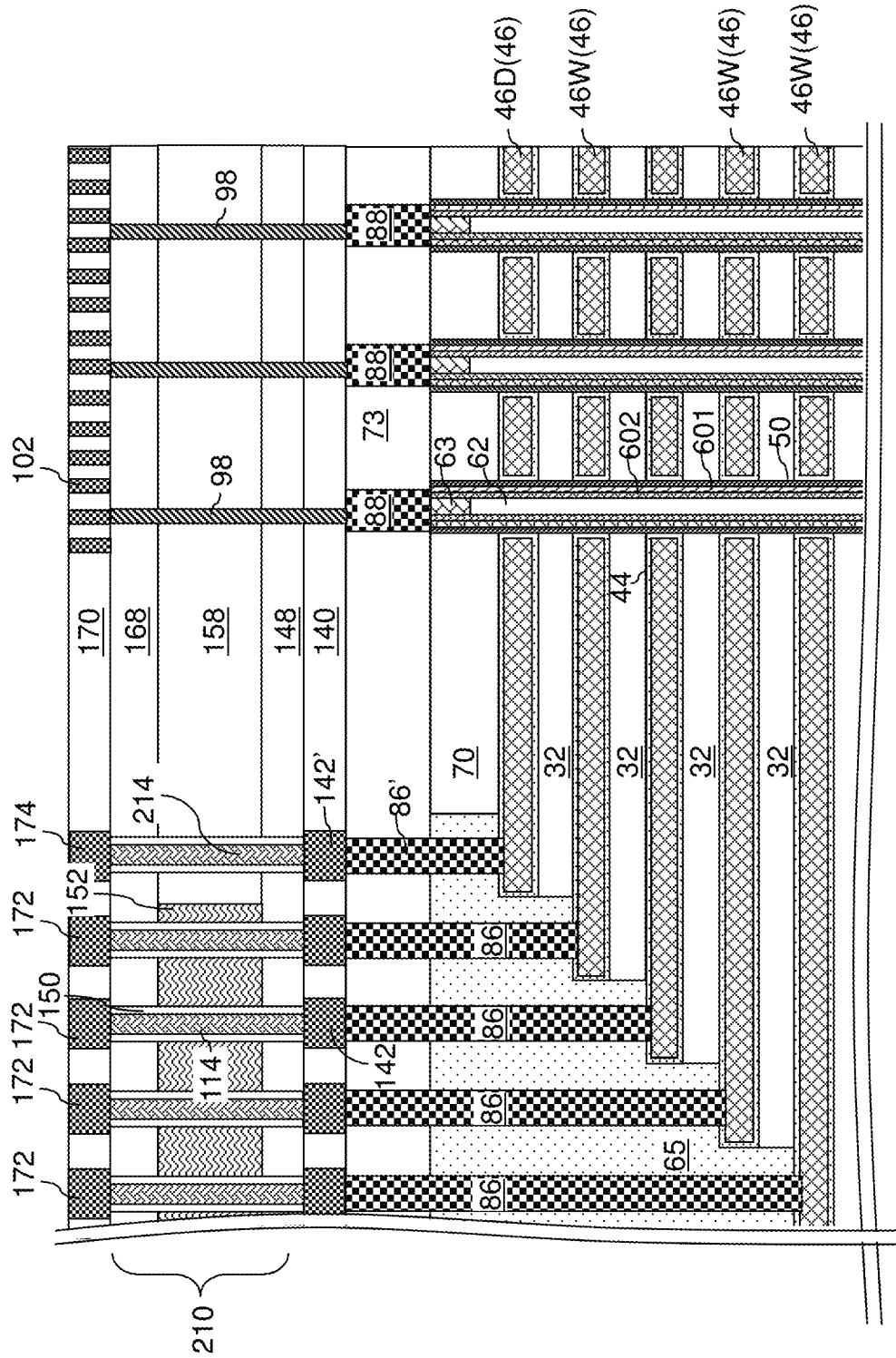
FIG. 21A is a schematic vertical cross-sectional view of the exemplary structure after formation of a bit line level dielectric layer, connector line structures, and bit lines according to an embodiment of the present disclosure.
Figure 21B:
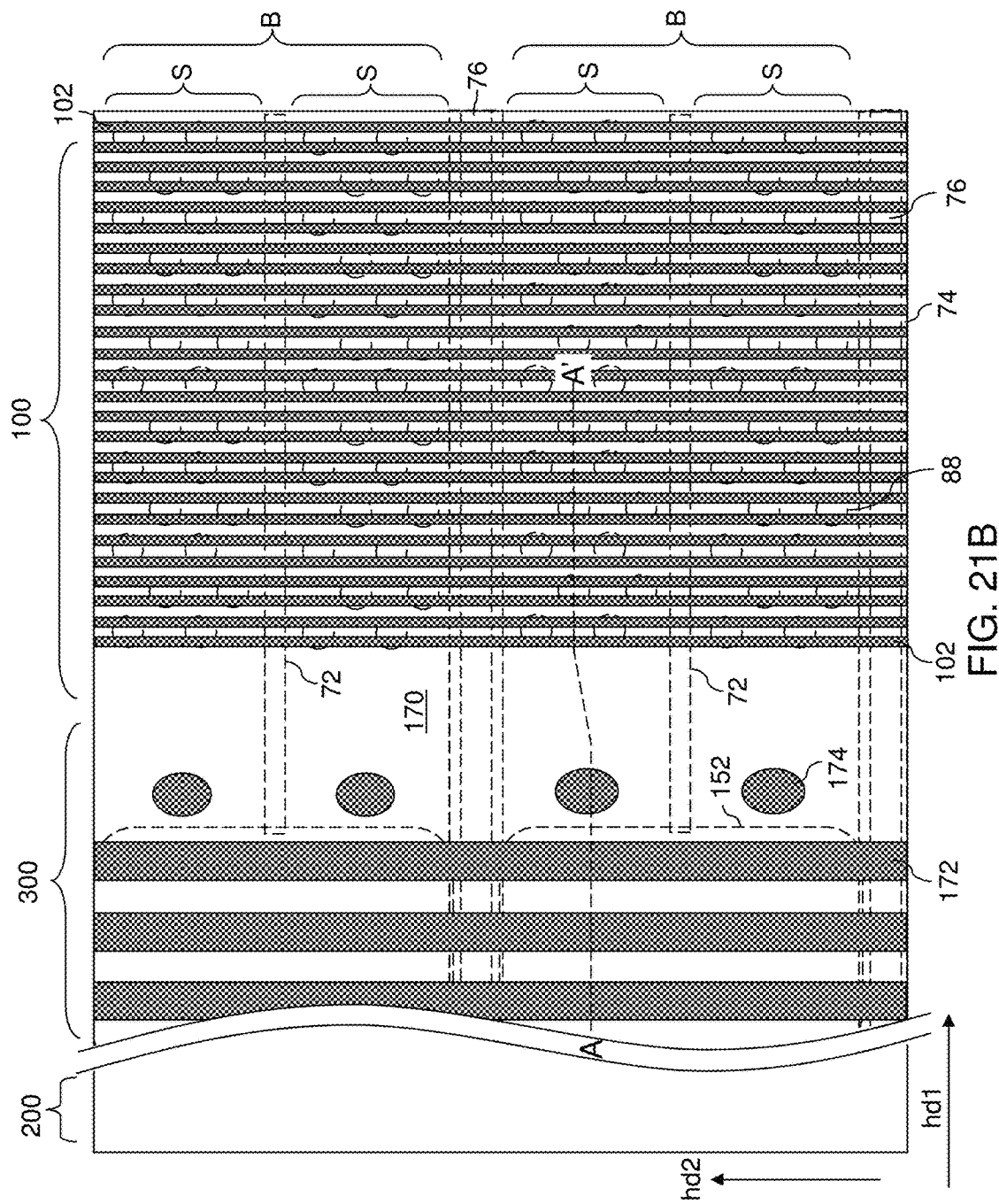
FIG. 21B is a top-down view of the exemplary structure of FIG. 21A. The vertical plane A-A' is the plane of the schematic vertical cross-sectional view of FIG. 21A.

Referring to FIGS. 21A and 21B, a bit line level dielectric layer 170 can be formed over the transistor level dielectric layers (148, 158, 168). The bit line level dielectric layer 170 includes a dielectric material such as silicon oxide, and can have a thickness in a range from 80 nm to 600 nm, such as from 160 nm to 300 nm, although lesser and greater thicknesses can also be employed.

Connector line structures 172, optional connecting pad structures 174, and bit lines 102 can be formed in the bit line level dielectric layer 170. Each connector line structure 172 can be formed directly on a respective plurality of semiconductor pillar structures (which comprise the semiconductor channels 114) that are arranged along the second horizontal direction hd2 and extending through a plurality of gate electrodes 152. Thus, each connector line structure 172 laterally extends along the second horizontal direction hd2, and is formed directly on a respective subset of the semiconductor pillar structures that is arranged along the second horizontal direction hd2 and extends over at least two vertically alternating stacks (32, 46) among the multiple vertically alternating stacks (32, 46).

The connector line structures 172 can be electrically connected to a respective subset of the electrically conductive strips 46 (e.g., to the word line electrically conductive strips 46W) through a subset of the semiconductor pillar structures (which comprise the semiconductor channels 114). Specifically, each of the connector line structures 172 can be electrically connected to a respective subset of the word line electrically conductive strips 46W that are vertically spaced from the substrate (9, 10) by a common vertical distance. The vertical distance between the substrate (9, 10) and a subset of the electrically conductive strips 46 that are electrically connected to a respective connector line structure 172 can be different for each connector line structure 172. In one embodiment, multiple electrically conductive strips 46 that are vertically spaced from the substrate (9, 10) by a common vertical distance and located in different sub-blocks S can be electrically connected to as same connector line structure 172 through a set of semiconductor pillar structures (which comprise the semiconductor channels 114) that are laterally surrounded by gate electrode 152. Each gate electrode surrounds two or more semiconductor channels 114.

The connecting pad structures 174 can be formed on a top surface of a respective one of the transistor level connecting via structures 214. Each connecting pad structure 174 can be formed directly on only one of the transistor level connecting via structures 214. The bit lines 102 can be formed on top surfaces of the array contact via structures 98. Each bit line 102 can be formed on a plurality of array contact via structures 98 located in a plurality of sub-blocks S and/or in a plurality of blocks B. In one embodiment, each bit line 102 can contact one array contact via structure 98 per sub-block S.

Figure 22A:
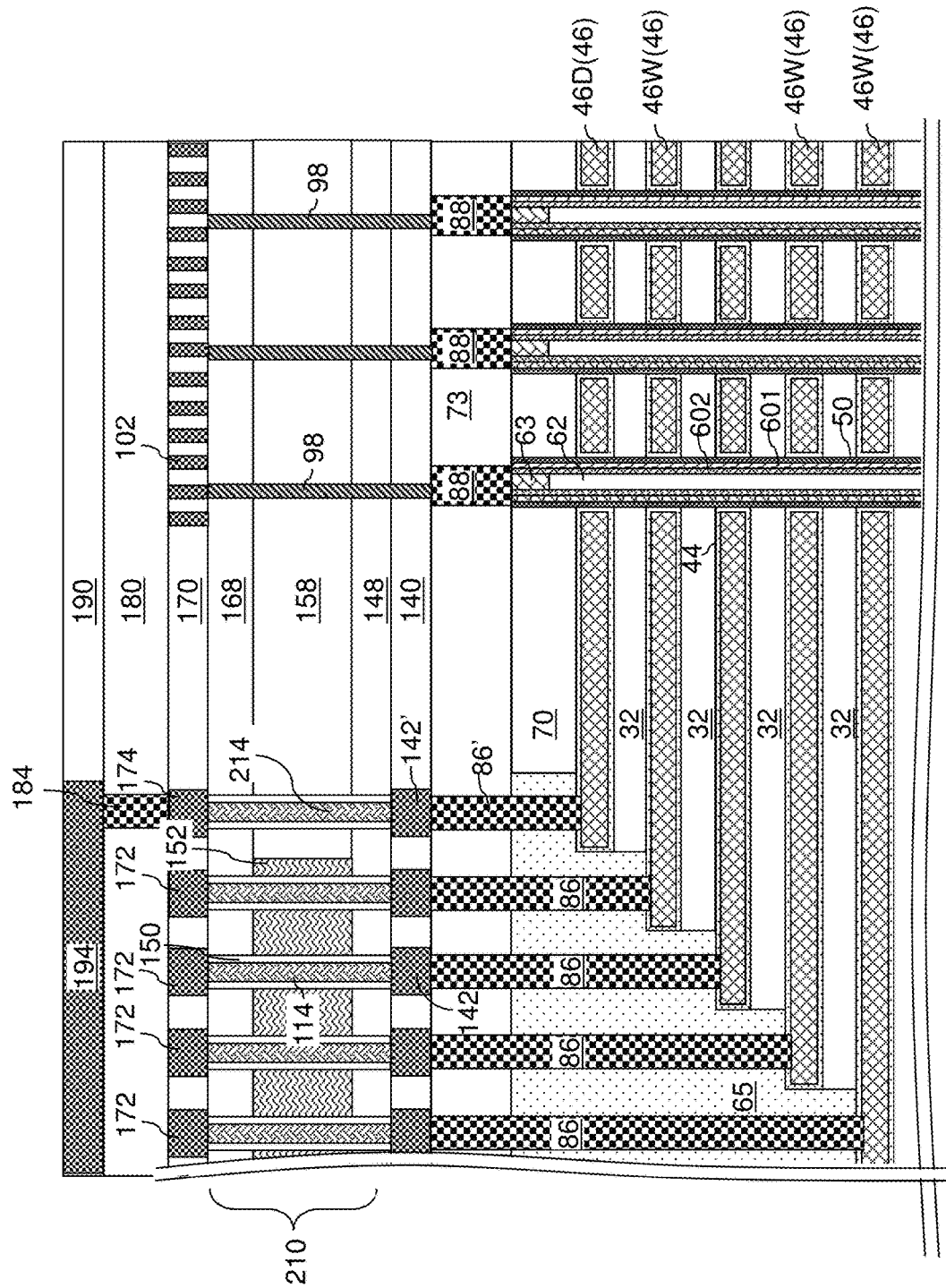
FIG. 22A is a schematic vertical cross-sectional view of the exemplary structure after formation of an interconnect via level dielectric layer, interconnect via structures, an interconnect line level dielectric layer, and interconnect line structures according to an embodiment of the present disclosure.
Figure 22B:
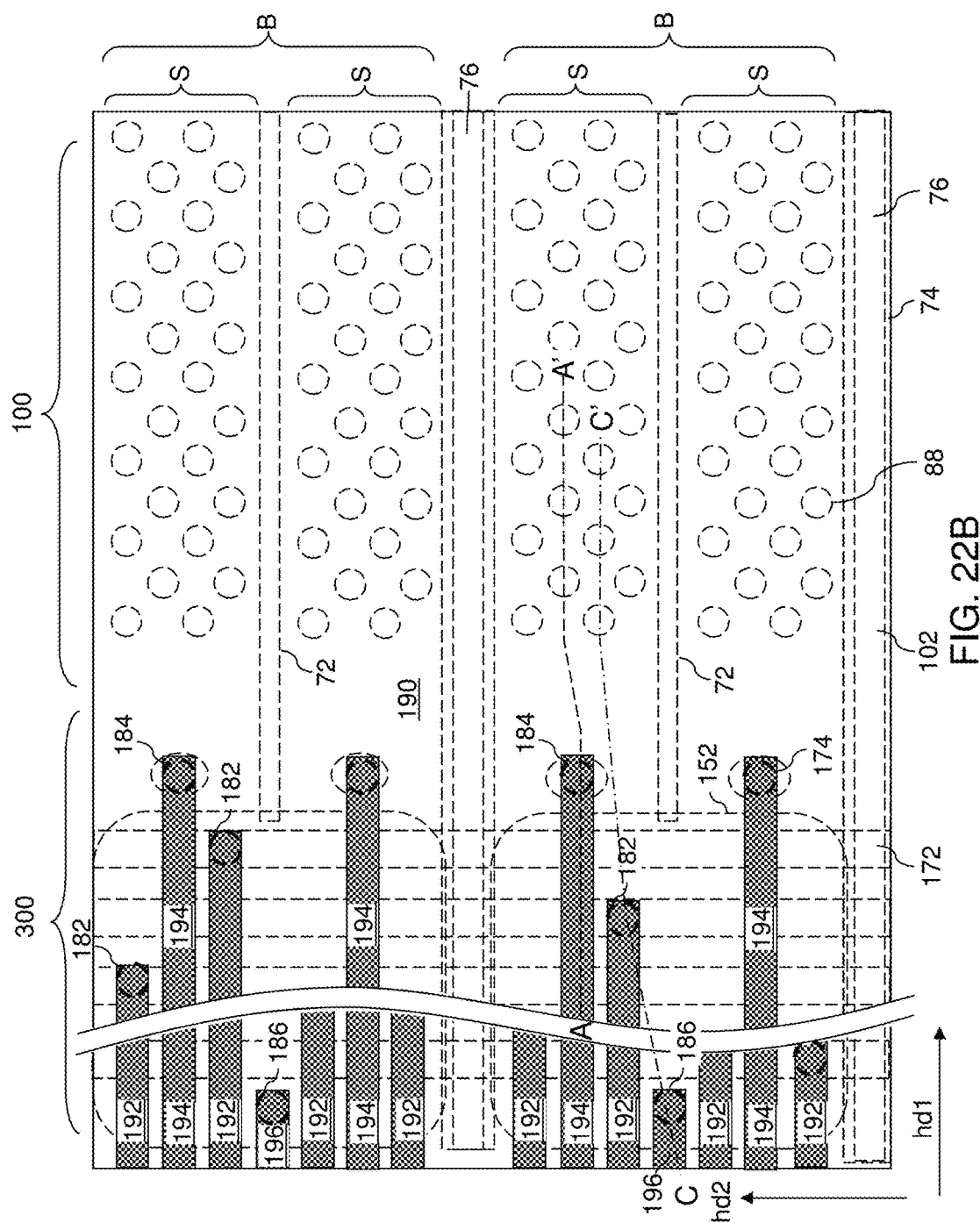
FIG. 22B is a top-down view of the exemplary structure of FIG. 22A. The vertical plane A-A' is the plane of the schematic vertical cross-sectional view of FIG. 22A.
Figure 22C:
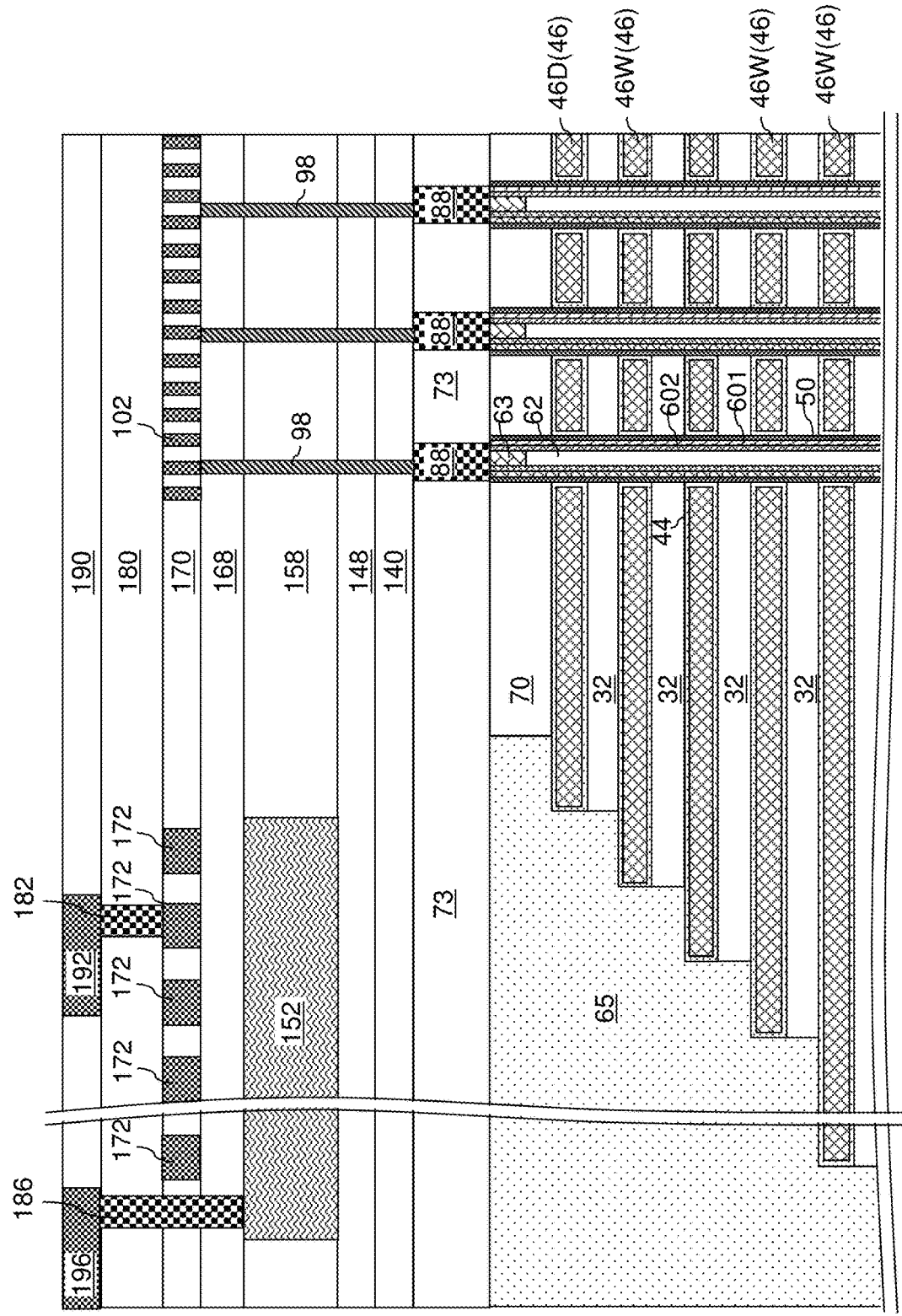
FIG. 22C is a schematic vertical cross-sectional view of the exemplary structure of FIGS. 22A and 22B. The vertical plane C-C' of FIG. 22B is the plane of the schematic vertical cross-sectional view of FIG. 22C.

Referring to FIGS. 22A-22C, additional dielectric material layers (180, 190) and additional metal interconnect structures (182, 184, 186, 192, 194, 196) can be subsequently formed. The additional dielectric material layers (180, 190) can include an interconnect via level dielectric layer 180 embedding interconnect via structures (182, 184, 186) and an interconnect line level dielectric layer 190 embedding interconnect line structures (192, 194, 196).

The interconnect via structures (182, 184, 186) can include word line interconnect via structures 182 contacting a respective one of the connector line structures 172. Each of the word line interconnect via structures 182 is electrically connected to upper ends of a subset of the semiconductor pillar structures (which comprise the semiconductor channels 114) through a respective connector line structures 172.

The interconnect via structures (182, 184, 186) can further include drain select interconnect via structures 184 contacting a respective one of the connecting pad structures 174. Each of the drain select interconnect via structures 184 is electrically connected to a transistor level connecting via structure 214 through a connecting pad structure 174.

The interconnect via structures (182, 184, 186) can further include gate interconnect via structures 186 contacting a respective one of the gate electrodes 152. Each of the gate interconnect via structures 186 can vertically extend through the interconnect via level dielectric layer 180, the bit line level dielectric layer 170, and the third transistor level dielectric layer 168.

The interconnect line structures (192, 194, 196) can include word line interconnect line structures 192 contacting a respective one of the word line interconnect line structures 182. Each of the word line interconnect line structures 192 is electrically connected to upper ends of a subset of the semiconductor pillar structures (which comprise the semiconductor channels 114) through a respective connector line structures 172 and a respective word line interconnect via structure 182. In one embodiment, the word line interconnect line structures 192 and the electrically conductive strips 46 of the multiple vertically alternating stacks (32, 46) laterally extend along the first horizontal direction hd1 (e.g., word line direction). Each of the connector line structures 172 can connect a respective one of the word line interconnect line structures 192 and upper ends of a respective subset of the semiconductor pillar structures (which comprise the semiconductor channels 114). In one embodiment, one word line interconnect line structure 192 can be formed per connector line structure 172. Since each connector line structure 172 is electrically connected to a plurality of word line contact via structures 86 located in a plurality of blocks B and to a plurality of word line electrically conductive strips 46W located in the plurality of block B, one word line interconnect via structure 172 can be provided for the plurality of word line electrically conductive strips 46W (i.e., word lines/control gates) located in the plurality of blocks B.

The interconnect line structures (192, 194, 196) can further include drain select interconnect line structures 194 contacting a respective one of the drain select interconnect via structure 184. Each of the drain select interconnect line structures 194 is electrically connected to a respective drain select level electrically conductive strip 46D through a respective drain select interconnect via structure 184, a respective connecting pad structure 174, a respective transistor level connecting line structure 214, and a respective drain select via contact pad structure 142'. The drain select interconnect line structures 194 can laterally extend along the first horizontal direction hd1.

The interconnect line structures (192, 194, 196) can further include gate interconnect line structures 196 contacting a respective one of the gate electrodes 152. The gate interconnect line structures 196 can laterally extend along the first horizontal direction hd1.

In case each of the connector line structures 172 extends over N number (where N is an integer greater than 1) of sub-blocks S, each of the connector line structures 172 can have N number of electrical connections to word line electrically conductive strips 46W that are located within the N number of sub-blocks S and are vertically spaced from the substrate (9, 10) by a respective common distance. N number of drain select interconnect via structures 184 and N number of drain select interconnect line structures 194 can be employed to control activation of each sub-block S. If there are P number (where P is an integer greater than 1) of sub-blocks S in each block B, then there are Q blocks where Q=P times N. If there are M number (where M is an integer greater than 1) of word line electrically conductive strips 46W (i.e., a subset of the electrically conductive strips 46 that function as word lines) in each block B (e.g., in the vertical direction), M connector line structures 172, M word line interconnect via structures 182, and M word line interconnect line structures 192 can be formed. A total of M×N field effect transistors including M×N semiconductor pillar structures (which comprise the semiconductor channels 114) can be formed, and can be controlled by G number of gate electrodes 152. In this case, G number of gate interconnect via structures 186 and G number of gate interconnect line structures 196 can be formed to control G groups of field effect transistors independently. In one embodiment, G can be the same as, or can be an integer multiple of N. In one embodiment, G can be the same as Q (i.e., the number of blocks B over which each of the connector line structures 172 extends).

For each vertical field effect transistor, a word line via contact pad structure 142 can function as a bottom active region, and a connector line structure 172 can function as a top active region. In one embodiment, the bottom active regions can function as source regions, and the top active regions can function as drain regions. Alternatively, the bottom active regions can function as drain regions, and the top active regions can function as source regions.

In the configuration shown in FIG. 22A, each transistor 210 comprises a depletion mode transistor (i.e., a normally ON transistor). The gate electrodes 152 can be biased to turn off the semiconductor channels 114 unless an underlying group of at least one sub-block S and/or at least one block B is selected for operation. Thus, the word line electrically conductive strips 46W can be activated only when a respective gate electrode 152 that controls a respective semiconductor channel 114 does not apply a control voltage that turns off the respective semiconductor channel 114.

Various configurations can be employed depending on the numbers M, N, and G. FIGS. 23A and 23B illustrate another configuration of the exemplary structure at the processing steps of FIGS. 22A-22C. Only a subset of the bit lines 102 is illustrated for clarity, and dielectric material layers are omitted from these figures for clarity. In this configuration, there are four sub-blocks S in each block B. A select transistor 210 is present on each word line contact structure (86, 172, 182, 192), which allows the control system to select each block B. Each word line contact structure (86, 172, 182, 192) can be used to contact word lines in two or more blocks B, by including connector line structures 172 each of which extends over two or more blocks B and are electrically connected to the word line contact via structures 86 in two or more blocks B through the select transistors 210. In other words, each connector line structures 172 is electrically connected to word lines (i.e., word line electrically conductive layers 46W) located at the same vertical device level in two or more blocks B. The select transistors 210 are located above the word line contact via structures 86 and below the connector line structures 172. The select transistors 210 are located between two vertical planes which contain the word line contact via structures 86 and the connector line structures 172, as shown in FIG. 23B.

Figure 24:
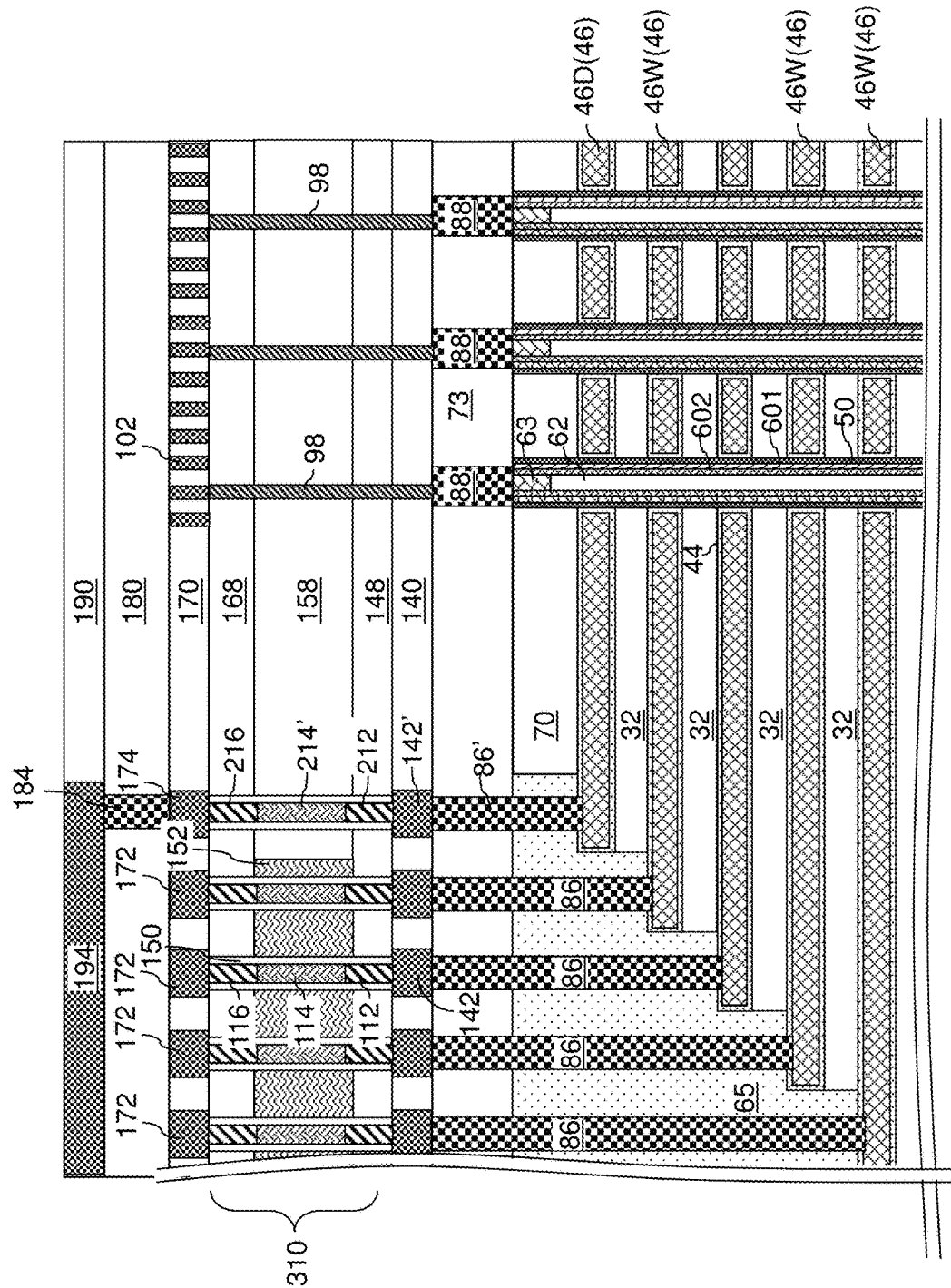
FIG. 24 is a schematic vertical cross-sectional view of a first alternative configuration of the exemplary structure according to an embodiment of the present disclosure.

Referring to FIG. 24, a first alternative configuration of the exemplary structure can be formed in which the select transistors 310 comprise enhancement mode transistors (i.e., normally OFF transistors) instead of the depletion mode transistors 210 discussed above. In this embodiment, the transistors 310 are turned on when a voltage is applied to the respective gate electrode 152. The structure of FIG. 24 can be derived from the first exemplary structure by forming bottom active regions 112 and 116 within each semiconductor pillar structure as provided as semiconductor channels 114. For example, if the semiconductor channels 114 have a doping of a first conductivity type, dopants of a second conductivity type that is the opposite of the first conductivity type can be implanted into the bottom portions and into the top portions of the semiconductor channels 114. The bottom portions of the semiconductor channels 114 are converted into semiconductor portions having a doping of the second conductivity type, and are herein referred to as bottom active regions 112. The top portions of the semiconductor channels 114 are converted into semiconductor portions having a doping of the second conductivity type, and are herein referred to as top active regions 116. In one embodiment, the bottom active regions 112 can function as source regions, and the top active regions 116 can function as drain regions. Alternatively, the bottom active regions 112 can function as drain regions, and the top active regions 116 can function as source regions. A transistor level connecting via structure (212, 214', 216) can include a first conductivity pillar portion 214', a second conductivity bottom pillar portion 212, and a second conductivity top pillar portion 216.

In this case, field effect transistors are formed over the word line contact via structures 86. The field effect transistors comprise semiconductor pillar structures (112, 114, 116) that are laterally surrounded by gate dielectrics 150 and a respective one of gate electrodes 152. Each of the gate electrodes 152 laterally surrounds a respective subset of the semiconductor pillar structures (112, 114, 116) that extends over at least two of the multiple vertically alternating stacks (32, 46). Bottom ends of the semiconductor pillar structures (112, 114, 116) are electrically connected to a respective one of the word line contact via structures 86.

Figure 25:
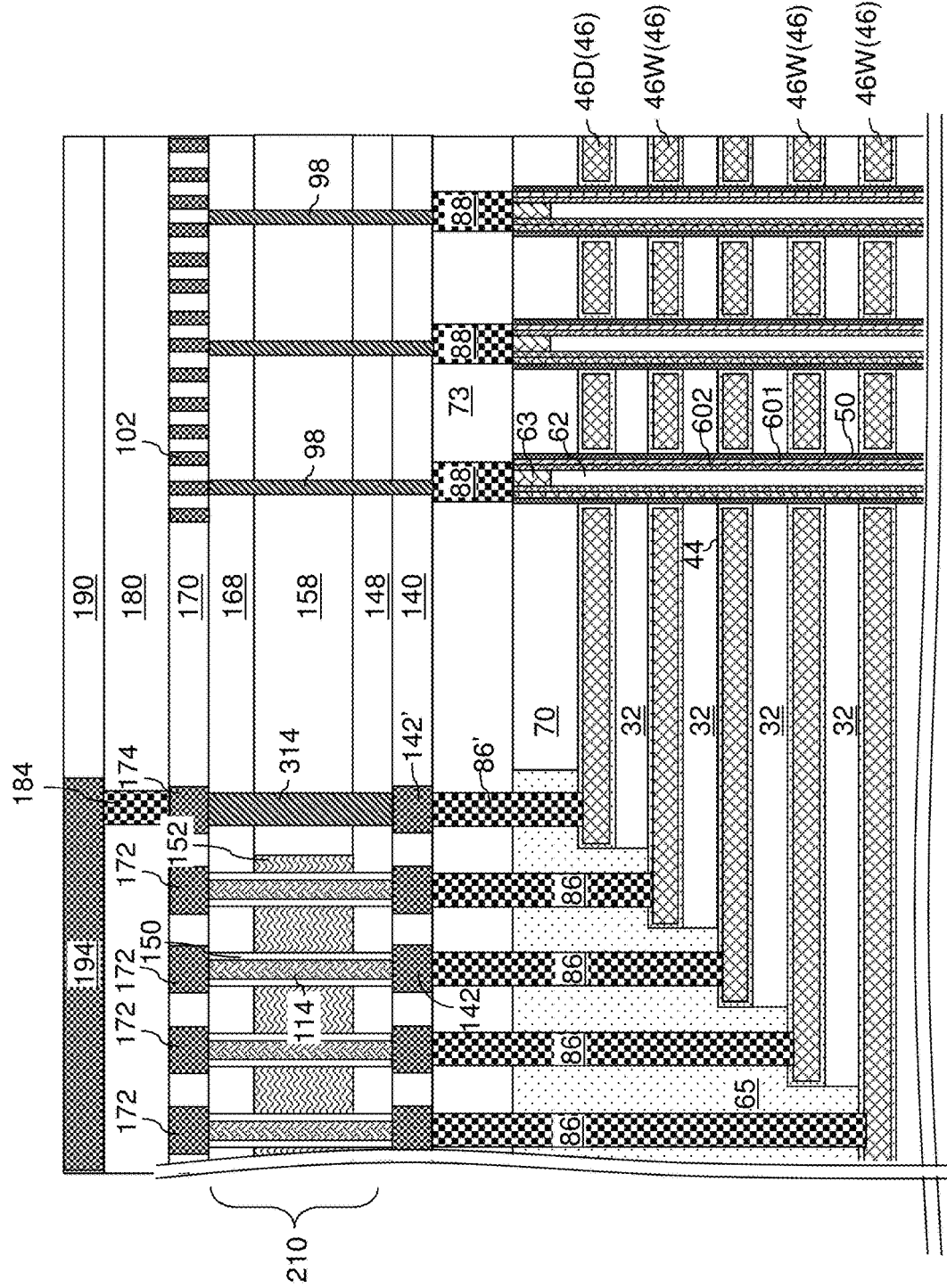
FIG. 25 is a schematic vertical cross-sectional view of a second alternative configuration of the exemplary structure according to an embodiment of the present disclosure.

Referring to FIG. 25, a second alternative configuration of the exemplary structure is provided, which is derived from the exemplary structure of FIGS. 22A-22C by forming the channel openings 169 and the connection openings 169' at different processing steps. The gate dielectrics 150 and the semiconductor channels 114 are formed in the channel openings, and transistor level connecting via structures 314 can be formed in the connection openings 169'. The transistor level connecting via structures 314 can include a doped semiconductor material or at least one metallic material (such as a combination of a TiN liner and a tungsten fill material portion).

Figure 26:
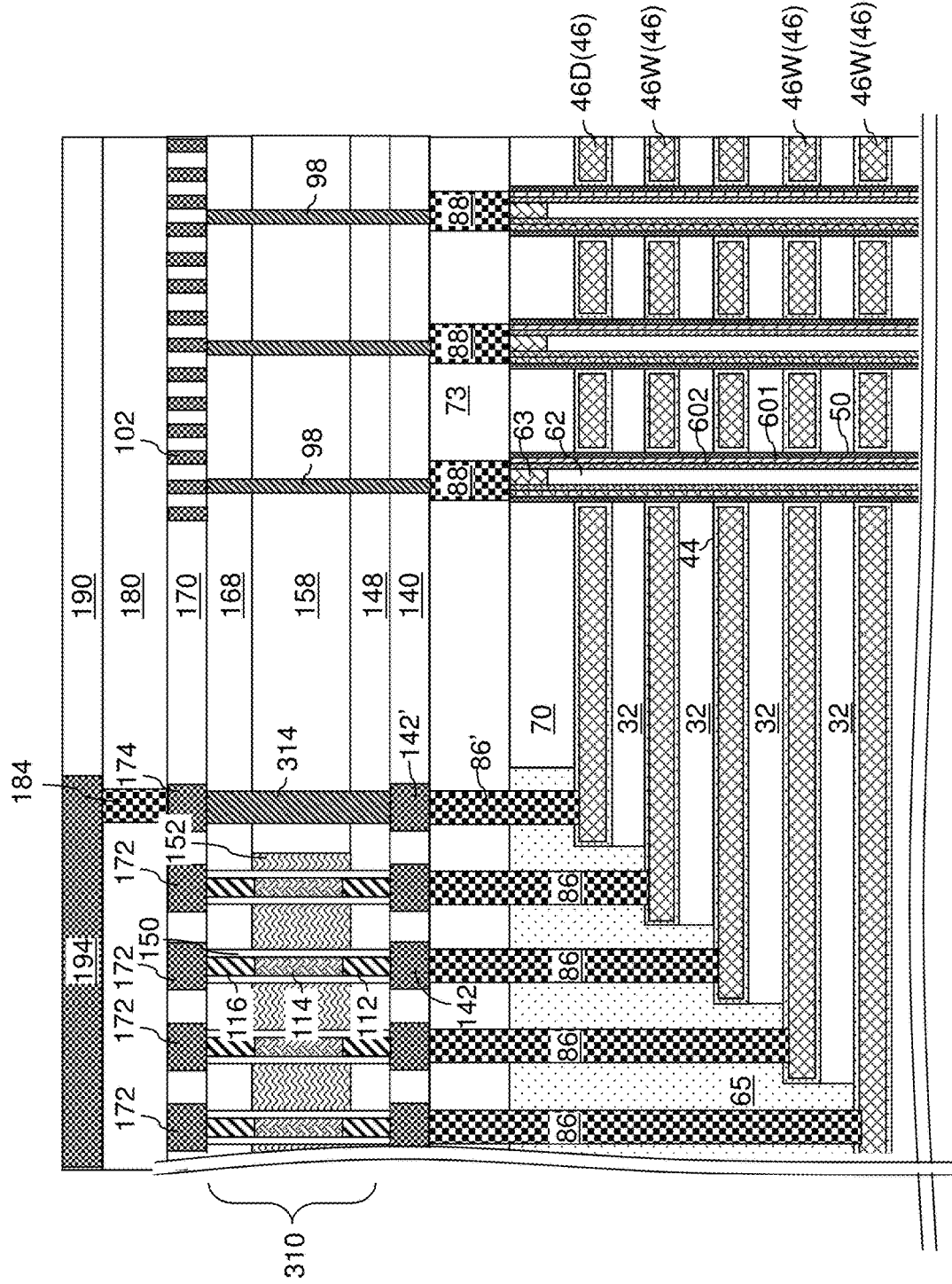
FIG. 26 is a schematic vertical cross-sectional view of a third alternative configuration of the exemplary structure according to an embodiment of the present disclosure.

Referring to FIG. 26, a third alternative configuration of the exemplary structure is provided, which is derived from the first alternative configuration of the exemplary structure of FIG. 24 by forming the channel openings 169 and the connection openings 169' at different processing steps. The gate dielectrics 150 and the semiconductor pillar structures (112, 114, 116) are formed in the channel openings 169, and transistor level connecting via structures 314 can be formed in the connection openings 169'. The transistor level connecting via structures 314 can include a doped semiconductor material or at least one metallic material (such as a combination of a TiN liner and a tungsten fill material portion).

Referring generally to all figures of the instant application, a three-dimensional memory device is provided, which includes: multiple vertically alternating stacks (32, 46W) of insulating strips 32 and word line electrically conductive strips 46W located over a substrate (9, 10), wherein the multiple vertically alternating stacks are laterally spaced from each other; memory stack structures 55 extending the multiple vertically alternating stacks (32, 46), wherein each of the memory stack structures 55 comprises a memory film 50 and a vertical semiconductor channel 60 contacting an inner sidewall of the memory film 50; word line contact via structures 86 contacting a top surface of the respective word line electrically conductive strips 46W; field effect transistors (210, 310) overlying the word line contact via structures 86 and comprising a semiconductor channel 114, a gate dielectric 150 and a gate electrode 152; and connector line structures 172 which are electrically connected to respective subsets of the word line electrically conductive strips 46W in different vertically alternating stacks through a subset of the semiconductor channels 114.

In one embodiment, the respective subsets of the word line electrically conductive strips 46 are vertically spaced from the substrate (9, 10) by a common vertical distance, and the semiconductor channels 114 of the field effect transistors comprise semiconductor pillar structures (i.e., the entire semiconductor pillar structure 114 shown in FIG. 23B or part of the pillar structure (112, 114, 116) shown in FIG. 24). Each bottom end of the semiconductor pillar structures is electrically connected to a respective word line electrically conductive strip 46W.

In one embodiment, the three-dimensional memory device further comprises word line interconnect line structures 192 electrically connected to respective upper ends of the semiconductor pillar structures {114 or (112, 114', 116)}, wherein the interconnect line structures 192 and the word line electrically conductive strips 46W of the multiple vertically alternating stacks (32, 46) laterally extend along a first horizontal direction (e.g., word line direction) hd1. The connector line structures 172 laterally extend along a second horizontal direction (e.g., bit line direction) hd2 that is different from the first horizontal direction hd1. Each of the connector line structures 172 electrically connects a respective one of the interconnect line structures 192 and upper ends of a respective subset of the semiconductor pillar structures {114 or (112, 114', 116)}. The semiconductor pillar structures are laterally surrounded by respective gate dielectrics 150 and a gate electrode 152.

In one embodiment, bottom ends of the respective subset of the semiconductor pillar structures {114 or (112, 114', 116)} are electrically connected to a respective one of a subset of the word line contact via structures 86 that have a same height. In one embodiment, each word line contact via structure 86 within the subset of the word line contact via structures is vertically spaced from the substrate (9, 10) by a same distance.

In one embodiment, the three-dimensional memory device further comprises transistor level connecting via structures (214, 314) located at a same level as the field effect transistors, not laterally surrounded by any of the gate electrodes 152, and electrically connected to a drain select electrode 46D located above the word line electrically conductive strips 46W.

In one embodiment, the multiple vertically alternating stacks (32, 46W) of insulating strips 32 and word line electrically conductive strips 46W are laterally spaced apart by backside trenches 79 that laterally extend along a first horizontal direction hd1. At least one dielectric material portion (such as an insulating spacer 74) is located inside each of the backside trenches 79 to provide electrical isolation between neighboring pairs of vertically alternating stacks (32, 46W). A source electrode 76 is located inside each of the backside trenches 79. The source electrode 76 contacts a source region 61 located in the substrate (9, 10). The word line electrically conductive strips 46W comprise word lines of a three-dimensional NAND memory device. Each vertically alternating stack comprises a memory block B. The connector line structures 176 are electrically connected to word lines two or more memory blocks B.

In one embodiment, each of the multiple vertically alternating stacks (32,46) comprises a respective terrace region in which each word line electrically conductive strip 46W therein has a monotonically decreasing lateral extent as a function of a distance from the substrate (9, 10); each of the terrace regions includes respective stepped surfaces that continuously extend from a bottommost layer within a respective vertically alternating stack (32,46W) to a topmost layer within the respective vertically alternating stack (32,46W); and each of the word line contact via structures 86 contacts a top surface of a respective one of the word line electrically conductive strips 46W within the terrace regions. As used herein, a "monotonically decreasing" refers to the state of always decreasing or remaining constant, and never increasing as defined in mathematics. In one embodiment, the three-dimensional memory device can further comprise a retro-stepped dielectric material portions 65 overlying a respective one of the stepped surfaces, wherein the word line contact via structures 86 vertically extend through the retro-stepped dielectric material portions 65.

The exemplary structures can include a three-dimensional memory device. In one embodiment, the three-dimensional memory device comprises a monolithic three-dimensional NAND memory device. The word line electrically conductive layers 46W can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (which comprises a portion of a charge storage layer 54 at a level of an word line electrically conductive layer 46W) in a first device level of the array of monolithic three-dimensional NAND strings can be located over another memory cell (which comprises another portion of the charge storage layer 54 at a level of another word line electrically conductive layer 46W) in a second device level of the array of monolithic three-dimensional NAND strings. The silicon substrate can contain an integrated circuit comprising a driver circuit (e.g., the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (which comprises portions of the memory films 50, i.e., portions of the charge storage layer 54). Each charge storage element can be located adjacent to a respective one of the plurality of semiconductor channels (59, 11, 60).

The embodiments of the present disclosure provide a select transistor on each word line contact structure, which allows the control system to select each block B. Each word line contact structure can be used to contact word lines in two or more blocks B, such as by including connector line structures which extend over two or more blocks B. This increases the amount of space available for word line electrical connection without increasing disturb stress time of the device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise.

Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   multiple vertically alternating stacks of insulating strips and word line electrically conductive strips located over a substrate, wherein the multiple vertically alternating stacks are laterally spaced from each other;
   memory stack structures extending through the multiple vertically alternating stacks, wherein each of the memory stack structures extends through a respective one of the multiple vertically alternating stacks and each of the memory stack structures comprises a memory film and a vertical semiconductor channel contacting an inner sidewall of the memory film;
   word line contact via structures contacting a top surface of the respective word line electrically conductive strips;
   field effect transistors overlying the word line contact via structures, each field effect transistor comprising a semiconductor channel, a gate dielectric and a gate electrode; and
   connector line structures which are electrically connected to respective subsets of the word line electrically conductive strips in different vertically alternating stacks through a subset of the semiconductor channels;
   wherein:
   the respective subsets of the word line electrically conductive strips are vertically spaced from the substrate by a common vertical distance;
   the semiconductor channels of the field effect transistors comprise semiconductor pillar structures; and
   each bottom end of the semiconductor pillar structures is electrically connected to a respective word line electrically conductive strip.

2. The three-dimensional memory device of claim 1, further comprising word line interconnect line structures electrically connected to respective upper ends of the semiconductor pillar structures, wherein the word line interconnect line structures and the word line electrically conductive strips of the multiple vertically alternating stacks laterally extend along a first horizontal direction.

3. The three-dimensional memory device of claim 2, wherein the connector line structures laterally extend along a second horizontal direction that is different from the first horizontal direction, and wherein each of the connector line structures electrically connects a respective one of the word line interconnect line structures and upper ends of a respective subset of the semiconductor pillar structures.

4. The three-dimensional memory device of claim 3, wherein the semiconductor pillar structures are laterally surrounded by respective gate dielectrics and a gate electrode.

5. The three-dimensional memory device of claim 3, wherein each bottom end of the semiconductor pillar structures is electrically connected to a respective one of a subset of the word line contact via structures that have a same height.

6. The three-dimensional memory device of claim 3, wherein each word line contact via structure within the subset of the word line contact via structures is vertically spaced from the substrate by a same distance.

7. The three-dimensional memory device of claim 1, further comprising transistor level connecting via structures located at a same level as the field effect transistors, not laterally surrounded by any of the gate electrodes, and electrically connected to a respective drain select electrode located above the word line electrically conductive strips.

8. The three-dimensional memory device of claim 1, wherein:
   the multiple vertically alternating stacks of insulating strips and word line electrically conductive strips are laterally spaced apart by backside trenches that laterally extend along a first horizontal direction;
   word line electrically conductive strips comprise word lines of a three-dimensional NAND memory device;
   each vertically alternating stack comprises a memory block; and
   the connector line structures are electrically connected to word lines two or more memory blocks.

9. The three-dimensional memory device of claim 8, further comprising:
   at least one dielectric material portion located inside each of the backside trenches which provides electrical isolation between neighboring pairs of vertically alternating stacks; and
   a source electrode located inside each of the backside trenches and which contacts a source region located in the substrate.

10. The three-dimensional memory device of claim 1, wherein:
    each of the multiple vertically alternating stacks comprises a respective terrace region in which each word line electrically conductive strip therein has a monotonically decreasing lateral extent as a function of a distance from the substrate;
    each of the terrace regions includes respective stepped surfaces that continuously extend from a bottommost layer within a respective vertically alternating stack to a topmost layer within the respective vertically alternating stack;
    each of the word line contact via structures contacts a top surface of a respective one of the word line electrically conductive strips within the terrace regions; and
    retro-stepped dielectric material portions overly a respective one of the stepped surfaces, wherein the word line contact via structures vertically extend through the retro-stepped dielectric material portions.

11. The three-dimensional memory device of claim 1, wherein:
    the three-dimensional memory device comprises a monolithic three-dimensional NAND memory device;
    the word line electrically conductive strips comprise, or are electrically connected to, a respective word line of the monolithic three-dimensional NAND memory device;
    the substrate comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive strips extend substantially parallel to a top surface of the substrate; and the array of monolithic three-dimensional NAND strings comprises:

a plurality of semiconductor channels, wherein at least one end portion of each of the plurality of semiconductor channels extends substantially perpendicular to the top surface of the substrate, and a plurality of charge storage elements, each charge storage element located adjacent to a respective one of the plurality of semiconductor channels.

12. A three-dimensional memory device comprising:

multiple vertically alternating stacks of insulating strips and word line electrically conductive strips located over a substrate, wherein the multiple vertically alternating stacks are laterally spaced from each other;

memory stack structures extending through the multiple vertically alternating stacks, wherein each of the memory stack structures extends through a respective one of the multiple vertically alternating stacks and each of the memory stack structures comprises a memory film and a vertical semiconductor channel contacting an inner sidewall of the memory film;

word line contact via structures contacting a top surface of the respective word line electrically conductive strips;

field effect transistors overlying the word line contact via structures, each field effect transistor comprising a semiconductor channel, a gate dielectric and a gate electrode;

connector line structures which are electrically connected to respective subsets of the word line electrically conductive strips in different vertically alternating stacks through a subset of the semiconductor channels; and transistor level connecting via structures located at a same level as the field effect transistors, not laterally surrounded by any of the gate electrodes, and electrically connected to a respective drain select electrode located above the word line electrically conductive strips.

13. A three-dimensional memory device comprising:

multiple vertically alternating stacks of insulating strips and word line electrically conductive strips located over a substrate, wherein the multiple vertically alternating stacks are laterally spaced from each other;

memory stack structures extending through the multiple vertically alternating stacks, wherein each of the memory stack structures extends through a respective one of the multiple vertically alternating stacks and each of the memory stack structures comprises a memory film and a vertical semiconductor channel contacting an inner sidewall of the memory film;

word line contact via structures contacting a top surface of the respective word line electrically conductive strips;

field effect transistors overlying the word line contact via structures, each field effect transistor comprising a semiconductor channel, a gate dielectric and a gate electrode;

connector line structures which are electrically connected to respective subsets of the word line electrically conductive strips in different vertically alternating stacks through a subset of the semiconductor channels;

wherein:

the three-dimensional memory device comprises a monolithic three-dimensional NAND memory device;

the word line electrically conductive strips comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive strips extend substantially parallel to a top surface of the substrate; and the array of monolithic three-dimensional NAND strings comprises:

a plurality of semiconductor channels, wherein at least one end portion of each of the plurality of semiconductor channels extends substantially perpendicular to the top surface of the substrate, and a plurality of charge storage elements, each charge storage element located adjacent to a respective one of the plurality of semiconductor channels.

* * * * *